(12) United States Patent
Kim et al.

(10) Patent No.: US 12,133,410 B2
(45) Date of Patent: Oct. 29, 2024

(54) DISPLAY DEVICE

(71) Applicant: Samsung Display Co., LTD., Yongin-si (KR)

(72) Inventors: Sang Yeol Kim, Hwaseong-si (KR); Eon Seok Oh, Seongnam-si (KR); Woo Sik Jeon, Hwaseong-si (KR); Jung Min Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 22 days.

(21) Appl. No.: 17/365,981

(22) Filed: Jul. 1, 2021

(65) Prior Publication Data

US 2022/0149323 A1 May 12, 2022

(30) Foreign Application Priority Data

Nov. 12, 2020 (KR) .......................... 10-2020-0150858

(51) Int. Cl.
*H10K 50/844* (2023.01)
*H10K 50/15* (2023.01)
(Continued)

(52) U.S. Cl.
CPC .......... *H10K 50/844* (2023.02); *H10K 71/00* (2023.02); *H10K 50/15* (2023.02); *H10K 50/16* (2023.02); *H10K 50/17* (2023.02); *H10K 50/171* (2023.02); *H10K 59/1201* (2023.02); *H10K 59/122* (2023.02); *H10K 59/124* (2023.02)

(58) Field of Classification Search
CPC .... H10K 50/844; H10K 50/16; H10K 50/171; H10K 50/15; H10K 50/17; H10K 71/00; H10K 59/12; H10K 59/1201; H10K 59/1211
See application file for complete search history.

(56) References Cited

U.S. PATENT DOCUMENTS 10,135,025 B2    11/2018 Kim et al.
10,396,311 B2     8/2019 Lee et al.
(Continued)

FOREIGN PATENT DOCUMENTS

KR    10-2017-0096646    8/2017
KR    10-2019-0027003    3/2019
(Continued)

OTHER PUBLICATIONS

Korean Office Action for Korean Patent Application No. 10-2020-0150858, dated May 24, 2024.

*Primary Examiner* — Vongsavanh Sengdara
(74) *Attorney, Agent, or Firm* — KILE PARK REED & HOUTTEMAN PLLC

(57) ABSTRACT

A display device includes: a substrate including an opening area, a peripheral area surrounding the opening area, and a display area surrounding the peripheral area; a transistor disposed on the display area of the substrate; a first electrode electrically connected to the transistor; an intermediate layer overlapping the first electrode; a second electrode disposed on the intermediate layer; a first dam disposed on the peripheral area of the substrate; and a first encapsulation inorganic layer disposed on the second electrode, wherein the first encapsulation inorganic layer is in contact with a side of the first dam in the peripheral area.

19 Claims, 16 Drawing Sheets

(51) Int. Cl.
    *H10K 50/16*     (2023.01)
    *H10K 50/17*     (2023.01)
    *H10K 59/12*     (2023.01)
    *H10K 59/122*     (2023.01)
    *H10K 59/124*     (2023.01)
    *H10K 71/00*     (2023.01)

(56) References Cited

U.S. PATENT DOCUMENTS

| | | |
|---|---|---|
| 10,840,317 B2 | 11/2020 | Oh et al. |
| 10,930,867 B2 | 2/2021 | Kim et al. |
| 11,355,728 B2 | 6/2022 | Kim et al. |
| 11,611,050 B2 | 3/2023 | Kim et al. |
| 2017/0148856 A1* | 5/2017 | Choi .................. H10K 59/873 |
| 2020/0212159 A1 | 7/2020 | Lee |
| 2020/0235180 A1 | 7/2020 | Park et al. |
| 2021/0143365 A1* | 5/2021 | Jo .................. H10K 59/124 |
| 2022/0115477 A1 | 4/2022 | Park et al. |

FOREIGN PATENT DOCUMENTS

| | | |
|---|---|---|
| KR | 10-2042532 | 11/2019 |
| KR | 10-2020-0067576 | 6/2020 |
| KR | 10-2020-0082492 | 7/2020 |
| KR | 10-2020-0090595 | 7/2020 |
| KR | 10-2020-0102580 | 9/2020 |
| KR | 10-2020-0113957 | 10/2020 |
| KR | 10-2022-0014425 | 2/2022 |

\* cited by examiner

DISPLAY DEVICE

CROSS-REFERENCE TO RELATED APPLICATION

This application claims priority from and the benefit of Korean Patent Application No. 10-2020-0150858, filed on Nov. 12, 2020, which is hereby incorporated by reference for all purposes as if fully set forth herein.

BACKGROUND

Field

Embodiments of the invention relate generally to a display device and more specifically, to a display device including a display panel with an opening area in a display area.

Discussion of the Background

Recently, as various portable electronic devices provide camera functions, the usage of a portable electronic device with a built-in camera function has been increasing rapidly compared to a case of separately carrying a camera.

Generally, as a camera, a flash, a speaker, a photosensor, and the like are provided outside of an image display area of the electronic device, the image display area of the electronic device has been decreased.

The above information disclosed in this Background section is only for understanding of the background of the inventive concepts, and, therefore, it may contain information that does not constitute prior art.

SUMMARY

Applicant realized that when a display device including a display panel and an electronic module is manufactured to have an opening area for the electronic module in a display area of the display panel, the display panel can be easily damaged by moisture and foreign particles that are permeated through the opening area.

Display devices including a display panel with an opening area for an electronic module constructed according to the principles of the invention are capable of preventing moisture and foreign particles from permeating into the display panel through the opening area in a display area of the display panel.

Further, the display devices constructed according to the principles of the invention are capable of reducing or minimizing a dead space around the opening area in the display area of the display panel.

In addition, the display devices constructed according to the principles of the invention have improved reliability by blocking the path through which moisture and/or foreign particles penetrate into the display panel through the opening area and a peripheral area surrounding the opening area. In addition, by reducing the area of the peripheral area, the wider display area of the display devices may be secured.

Additional features of the inventive concepts will be set forth in the description which follows, and in part will be apparent from the description, or may be learned by practice of the inventive concepts.

According to an aspect of the invention, a display device includes: a substrate including an opening area, a peripheral area surrounding the opening area, and a display area surrounding the peripheral area; a transistor disposed on the display area of the substrate; a first electrode electrically connected to the transistor; an intermediate layer overlapping the first electrode; a second electrode disposed on the intermediate layer; a first dam disposed on the peripheral area of the substrate; and a first encapsulation inorganic layer disposed on the second electrode, wherein the first encapsulation inorganic layer is in contact with a side of the first dam in the peripheral area.

The first encapsulation inorganic layer may be in contact with an upper surface of the first dam.

The display device may further include: a second dam disposed on the peripheral area of the substrate; and a first layer disposed on the second dam, and wherein the first layer may include a same material as that of at least a part of the intermediate layer.

The intermediate layer and the first layer may include at least one of a hole transport layer, a hole injection layer, an electron injection layer, and an electron transport layer.

The first encapsulation inorganic layer may be in contract with a side of the second dam, and the first encapsulation inorganic layer may be in contact with an upper surface of the second dam.

The first layer may be in contact with the first encapsulation inorganic layer.

The display device may further include one or more second layers disposed between the first dam and the opening area, and the one or more second layers may include a same material as that of at least a part of the intermediate layer.

The display device may further include an inorganic insulating layer disposed between the transistor and the substrate, and the one or more second layers expose the inorganic insulating layer.

Ends of the substrate, the inorganic insulating layer, and the first encapsulation inorganic layer may define an inner surface of the opening area.

The intermediate layer and the one or more second layers may include at least one of a hole transport layer, a hole injection layer, an electron injection layer, and an electron transport layer.

The display device may further include a third layer overlapping at least a part of an upper surface of the first dam, and the third layer may include a same material as that of at least a part of the intermediate layer.

An edge of the third layer and an edge of the upper surface of the first dam may be aligned.

The display device may further include: an encapsulation organic layer disposed on the first encapsulation inorganic layer; and a second encapsulation inorganic layer disposed on the encapsulation organic layer, and wherein the first encapsulation inorganic layer and the second encapsulation inorganic layer may be in contact with each other between the first dam and the opening area.

According to another aspect of the invention, a display device includes: a substrate including an opening area, a peripheral area surrounding the opening area, and a display area surrounding the peripheral area; a transistor disposed on the substrate; a first electrode electrically connected to the transistor; an intermediate layer overlapping the first electrode; a second electrode disposed on the intermediate layer; a dam disposed on the peripheral area of the substrate; and a first encapsulation inorganic layer disposed on the second electrode and overlapping the dam, wherein: ends of the intermediate layer and the second electrode overlap the peripheral area, and the first encapsulation inorganic layer covers the ends of the intermediate layer and the second electrode and is in contact with at least a part of a side of the dam.

The first encapsulation inorganic layer may completely cover the side of the dam.

The first encapsulation inorganic layer may cover an upper surface of the dam.

The display device may further include an inorganic insulating layer disposed between the substrate and the transistor, and the first encapsulation inorganic layer may be in contact with at least a part of the inorganic insulating layer on the peripheral area of the substrate.

The dam may include a first dam and a second dam, and the first encapsulation inorganic layer may be in contact with a side of at least any one of the first dam and the second dam.

The intermediate layer may include at least one of a hole transport layer, a hole injection layer, an electron injection layer, and an electron transport layer.

The display device may further include an encapsulation organic layer and a second encapsulation inorganic layer disposed on the first encapsulation inorganic layer, and wherein, in at least a part of the peripheral area, the first encapsulation inorganic layer and the second encapsulation inorganic layer may be in contact with each other.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
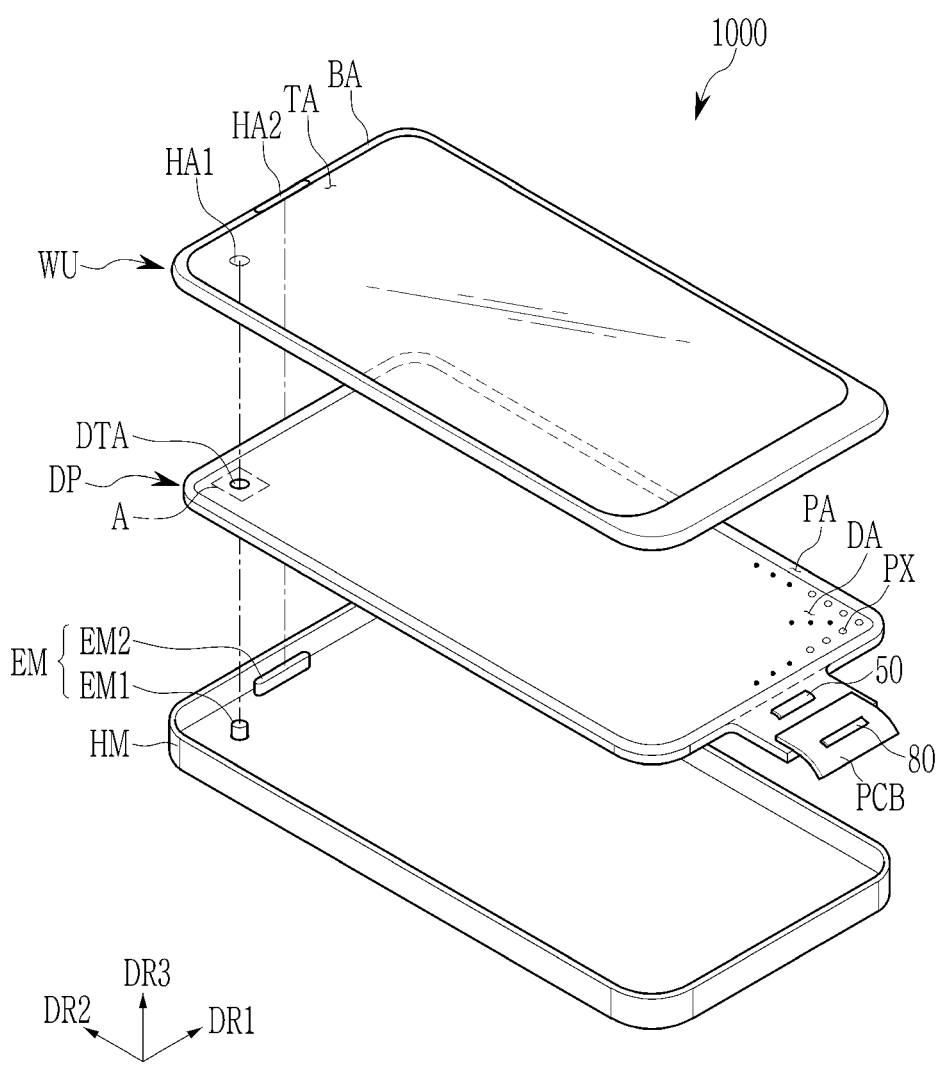
FIG. 1 is an exploded perspective view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Further, throughout the description, the phrase "in a plan view" means viewing a target portion from the top, and the phrase "on a cross-section" means viewing a cross-section formed by vertically cutting a target portion from the side.

Hereinafter, a display device according to an embodiment is schematically described with reference to FIGS. 1, 2, and 3. FIG. 1 is an exploded perspective view of a display device according to an embodiment, FIG. 2 is a schematic cross-sectional view of a display device according to an embodiment, and FIG. 3 is a top plan view showing some constituent elements of a display panel according to an embodiment.

Figure 2:
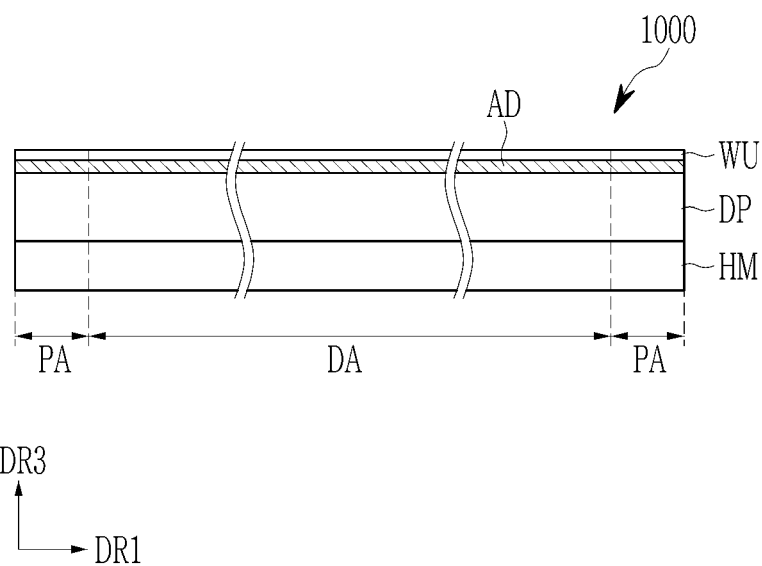
FIG. 2 is a schematic cross-sectional view of the display device of FIG. 1.
Figure 3:
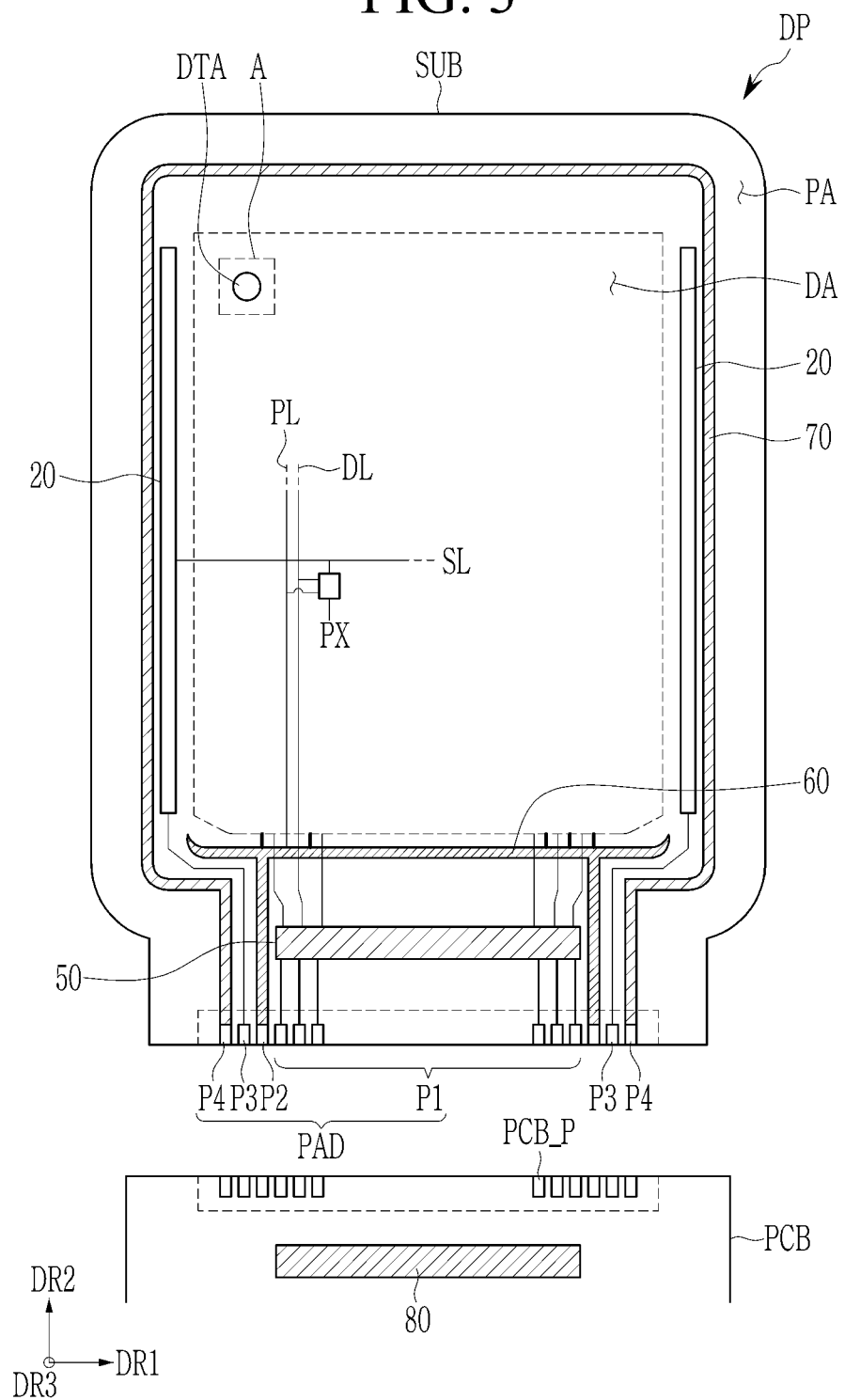
FIG. 3 is a top plan view showing some constituent elements of the display panel of FIG. 1.

First, referring to FIGS. 1 and 2, a display device 1000 displays an image toward a third direction DR3 on a plane defined by a first direction DR1 and a second direction DR2. The front (e.g., a top) and the back (e.g., a bottom) of each member are distinguished by the third direction DR3. The directions indicated by the first, second, and third directions DR1, DR2, and DR3 are relative concepts and may be converted into other directions.

The display device 1000 includes a cover window WU, a display panel DP, and a housing member HM. In an embodiment, the cover window WU, the display panel DP, and the housing member HM are combined to constitute the display device 1000.

The cover window WU is disposed on the display panel DP to protect the display panel DP. The cover window WU may include a transmittance area TA and a blocking area BA. The transmittance area TA is an optically transparent area and may be an area that transmits incident light. The blocking area BA may be an area having relatively low light transmittance compared to the transmittance area TA. The blocking area BA defines a shape of the transmittance area TA. The blocking area BA may surround the transmittance area TA. The blocking area BA may have a predetermined color. The blocking area BA overlaps the non-display area PA of the display panel DP to block the non-display area PA from being visually recognized from the outside.

The cover window WU may include a first hole area HA1 and a second hole area HA2. Each of the first hole area HA1 and the second hole area HA2 may overlap an electronic module EM described later. The electronic module EM may be operated by receiving external signals provided through the first hole area HA1 and the second hole area HA2.

According to an embodiment, the first hole area HA1 may be positioned in the transmittance area TA, and the second hole area HA2 may be positioned in the blocking area BA. However, embodiments are not limited thereto. For example, the first hole area HA1 and the second hole area HA2 may be positioned in opposite areas. For example, both the first hole area HA1 and the second hole area HA2 may be positioned in the transmittance area TA or in the blocking area BA.

In each of the first hole area HA1 and the second hole area HA2, a predetermined recessed portion recessed from the rear surface of the cover window WU may be defined. The recessed portion may include a groove portion or an opening area having a greater depth than the thickness of the cover window WU.

The first hole area HA1 and the second hole area HA2 may have different shapes from each other. The first hole area HA1 may have a circular shape in a plan view and the second hole area HA2 may have an elliptical shape having a long axis extending along the first direction DR1 in a plan view. However, embodiments are not limited thereto. For example, the shapes of the first hole area HA1 and the second hole area HA2 may be variously modified.

The display panel DP may be a flat rigid display panel, but embodiments are not limited thereto. For example, the display panel DP may be a flexible display panel. The display panel DP according to an embodiment may be a light-emissive display panel, and is not particularly limited thereto. For example, the display panel DP may be an organic light emitting panel or a quantum dot light emitting display panel. The intermediate layer of the organic light emitting panel may include an organic light emitting material. The intermediate layer of the quantum dot light emitting display panel may include a quantum dot and a quantum rod. Hereinafter, the display panel DP is described as an organic light emitting panel.

The display panel DP displays an image on the front. The front of the display panel DP includes a display area DA and a non-display area PA. The image is displayed in the display area DA. The non-display area PA may surround the display area DA.

The display panel DP may include a plurality of pixels PX positioned in the display area DA. The pixels PX may display light in response to an electrical signal. The light emitted by the pixels PX may generate an image. The number of transistors and capacitors included in one pixel PX and the connection relationship may be varied in different ways.

The display panel DP according to an embodiment may include an opening area DTA penetrating the display panel DP. The opening area DTA may be positioned on the display area DA. The area A, in which the opening area DTA is positioned, is described later. The opening area DTA may overlap the first hole area HA1 of the cover window WU. Some of a plurality of pixels PX may be disposed to surround the opening area DTA. Therefore, the image may also be displayed in the area adjacent to the opening area DTA.

The display panel DP includes the non-display area PA extended from the display area DA and including a plurality of signal lines and a pad part. A data driver 50 may be positioned in the non-display area PA. According to an embodiment, the pad part of the non-display area PA may be electrically connected to a printed circuit board (PCB) including a driving chip 80. The pad part is described later in more detail in FIG. 3.

As shown in FIG. 2, an adhesive layer AD, which attaches the display panel DP and the cover window WU, may be positioned between the display panel DP and the cover window WU. For example, a touch unit positioned between the display panel DP and the cover window WU may be further included. The touch unit may be disposed on the display panel DP to provide a touchscreen function of the display device 1000. The touch unit may be integrally formed on the display panel DP. The touch unit may include a touch electrode of various patterns, and may be a resistive film type or a capacitance type.

The electronic module EM includes various functional modules for operating the display device 1000. The electronic module EM may be electrically connected to the display panel DP through a connector. For example, the electronic module EM may be a camera, a speaker, or a sensor for detecting light or heat.

The electronic module EM may include a first electronic module EM1 and a second electronic module EM2. The first electronic module EM1 may detect an external object through the opening area DTA and the first hole area HA1. The first electronic module EM1 may receive external inputs transmitted through the opening area DTA and the first hole area HA1 or provide outputs through the opening area DTA and the first hole area HA1.

For example, the first electronic module EM1 may be at least any one of a light emitting module, a light sensing module, and a photographing module. For example, the first electronic module EM1 may include at least one of a light emitting module that outputs infrared light, a CMOS sensor for infrared detection, and a camera module that photographs an external subject.

The second electronic module EM2 may collect sound signals such as voice through the second hole area HA2 or provide sound signals such as processed voice to the outside. For example, the second electronic module EM2 may include at least one of an acoustic input module and an acoustic output module. The acoustic input module may include a microphone capable of receiving an acoustic signal. The sound output module may include a speaker that outputs sound data as a sound signal.

However, this is illustrated by way of example, and the electronic module EM may consist of a single module, may further include a greater number of the electronic modules, may be arranged in various arrangement relationships, and embodiments are not limited thereto.

The housing member HM is disposed under the display panel DP. The housing member HM is combined with the cover window WU to form the exterior of the display device 1000. The housing member HM may contain a material having relatively high rigidity. For example, the housing member HM may include a plurality of frames and/or plates made of glass, plastic, and metal.

The housing member HM provides a predetermined accommodation space. The display panel DP may be accommodated in the accommodation space to be protected from external impact.

Next, referring to FIG. 3, the display panel DP includes a substrate SUB including the display area DA and the non-display area PA. The non-display area PA may be defined along the border of the display area DA.

The display panel DP includes a plurality of pixels PX. A plurality of pixels PX may be disposed in the display area DA on the substrate SUB. Each pixel PX includes a light emitting element and a driving circuit part connected thereto. Each pixel PX emits light of, e.g., red, green, and blue, or white, and may include an organic light emitting element (e.g., an organic light emitting diode) as an example.

The display panel DP may include a plurality of signal lines and a pad part. The plurality of signal lines may include a scan line SL extending in the first direction DR1, and a data line DL and a driving voltage line PL extending in the second direction DR2.

A scan driver 20 generates and transmits a scan signal to each pixel PX through the scan line SL. According to an embodiment, the scan driver 20 may be disposed on the left and right sides of the display area DA. This specification describes a structure in which the scan driver 20 is disposed on both sides of the substrate SUB. However, embodiments are not limited thereto. For example, in another embodiment, the scan driver may be disposed only on one side of the substrate SUB.

The pad part PAD is disposed on one end of the display panel DP and includes a plurality of terminals P1, P2, P3, and P4. The pad part PAD is exposed without being covered by an insulating layer, and may be electrically connected to the printed circuit board (PCB). The pad part PAD may be electrically connected to the pad part PCB_P of the printed circuit board (PCB). The printed circuit board (PCB) may transmit a signal or power of the driving chip 80 to the pad part PAD.

The controller converts a plurality of image signals transmitted from the outside into a plurality of image data signals and transmits the converted signals to the data driver 50 through the terminal P1. In addition, the controller may receive a vertical synchronization signal, a horizontal synchronizing signal, and a clock signal, generates a control signal for controlling the driving functions of the scan driver 20 and the data driver 50, and transmits the control signal to each through the terminals P1 and P3. The controller transmits a driving voltage ELVDD to driving voltage supply wiring 60 through the terminal P2. In addition, the controller transmits a common voltage ELVSS to each common voltage supply wiring 70 through the terminal P4.

The data driver 50 is disposed on the non-display area PA, and generates and transmits a data signal to each pixel PX. For example, the data driver 50 may be disposed on one side of the display panel DP, and may be disposed between the pad part PAD and the display area DA.

The driving voltage supply wiring 60 is disposed on the non-display area PA. For example, the driving voltage supply wiring 60 may be disposed between the data driver 50 and the display area DA. The driving voltage supply wiring 60 provides the driving voltage ELVDD to the pixels PX. The driving voltage supply wiring 60 may extend in the first direction DR1, and may be connected to a plurality of driving voltage lines PL extending in the second direction DR2.

The common voltage supply wiring 70 is disposed on the non-display area PA. The common voltage supply wiring 70 may have a shape surrounding the substrate SUB. The common voltage supply wiring 70 transmits the common voltage ELVSS to one electrode (e.g., a second electrode) of the light emitting element included in the pixel PX.

Figure 4:
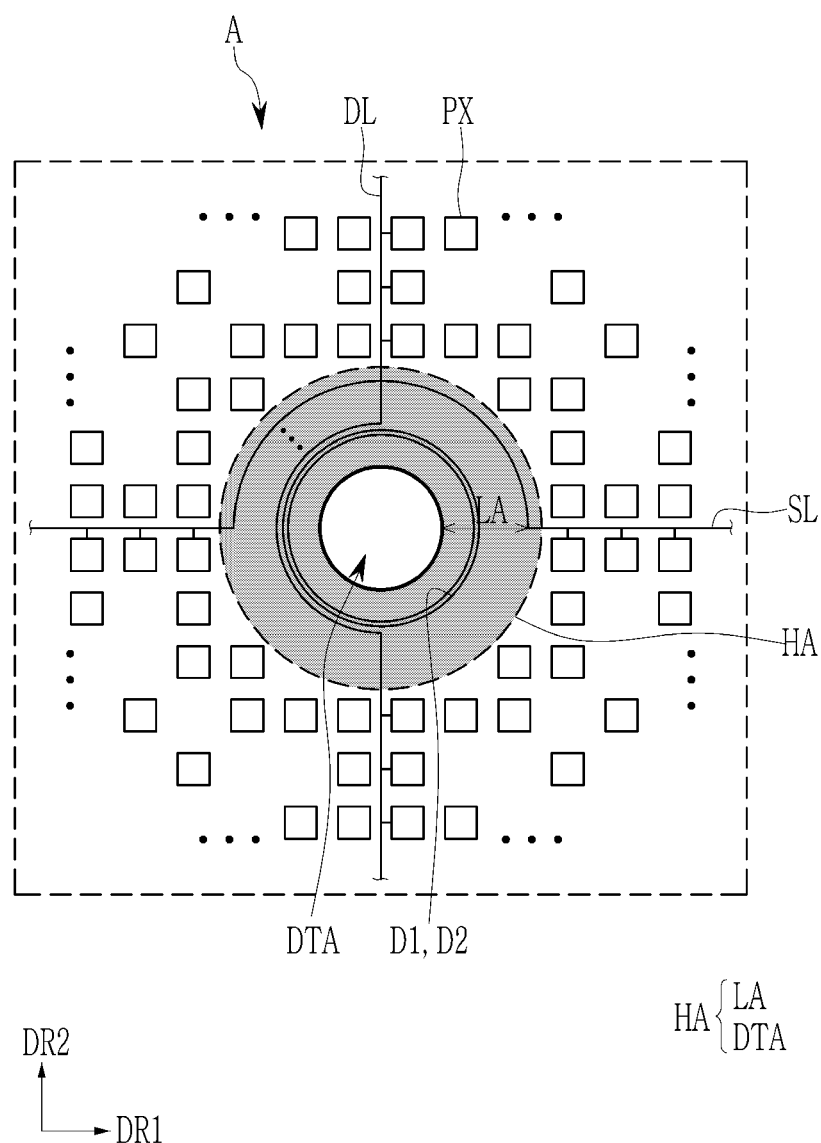
FIG. 4 is an enlarged top plan view of an area A of FIGS. 1 and 3.

Next, the area A including the opening area DTA shown in FIG. 3 is described with reference to FIG. 4. FIG. 4 is an enlarged top plan view of an area A of FIGS. 1 and 3.

Referring to FIG. 4 with the above-described drawings, the display panel DP includes a plurality of signal lines SL and DL and a plurality of pixels PX, which are disposed on the substrate. Each of a plurality of pixels PX may be connected to a plurality of signal lines SL and DL. FIG. 4 describes the scan line SL and the data line DL among a plurality of signal lines as an example. However, this is illustrated as an example, and each pixel PX according to an embodiment may be additionally connected to various signal lines, and embodiments are not limited thereto.

The hole area HA included in the display panel DP includes an opening area DTA and a peripheral area LA surrounding the opening area DTA.

The peripheral area LA is an area surrounding the periphery of the opening area DTA. The peripheral area LA may be provided to prevent damage to the wirings when irradiating a laser to form the opening area DTA. The peripheral area LA may have a minimum constant width to protect the wirings from the laser. For example, the peripheral area LA includes dams D1 and D2.

The scan line SL and the data line DL may have a semicircular structure, overlap the peripheral area LA, and bypass the opening area DTA. A plurality of scan lines SL extend in the horizontal direction (e.g., in the first direction DR1) and are curved along the periphery of the opening area DTA. Here, a plurality of scan lines SL may include a scan line for a scan signal, a light emission control line for a light emission control signal, an initialization voltage line for an initialization voltage, or the like. A plurality of data lines DL extend in the vertical direction (e.g., in the second direction DR2) and are curved along the periphery of the opening area DTA. A plurality of data lines DL may be composed of a driving voltage line for a driving voltage and a driving low voltage line for a driving low voltage. According to an embodiment, a plurality of scan lines SL and a plurality of data lines DL may be changed.

Figure 5A:
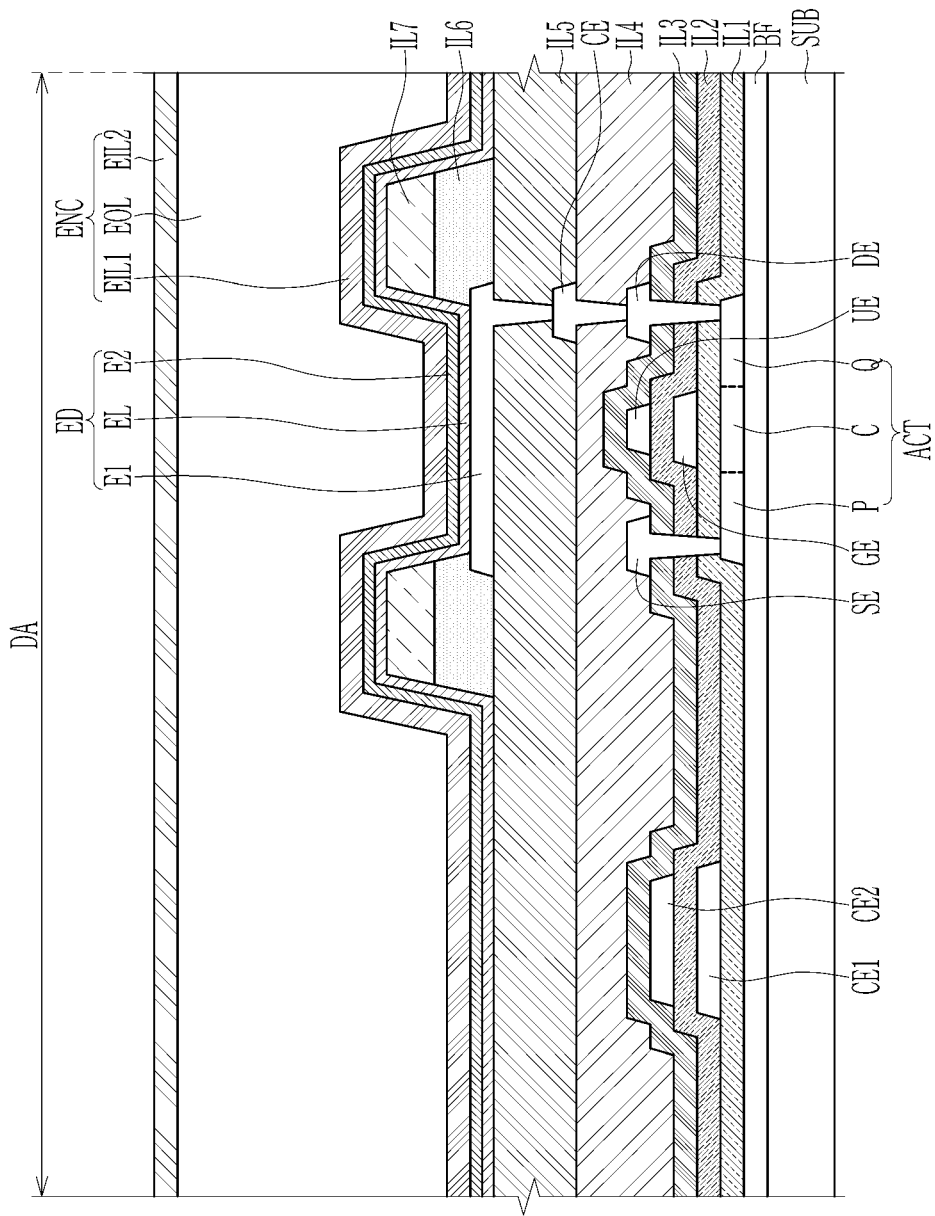
FIG. 5A is a cross-sectional view of the display panel of FIG. 1 illustrating a display area of the display panel.
Figure 5B:
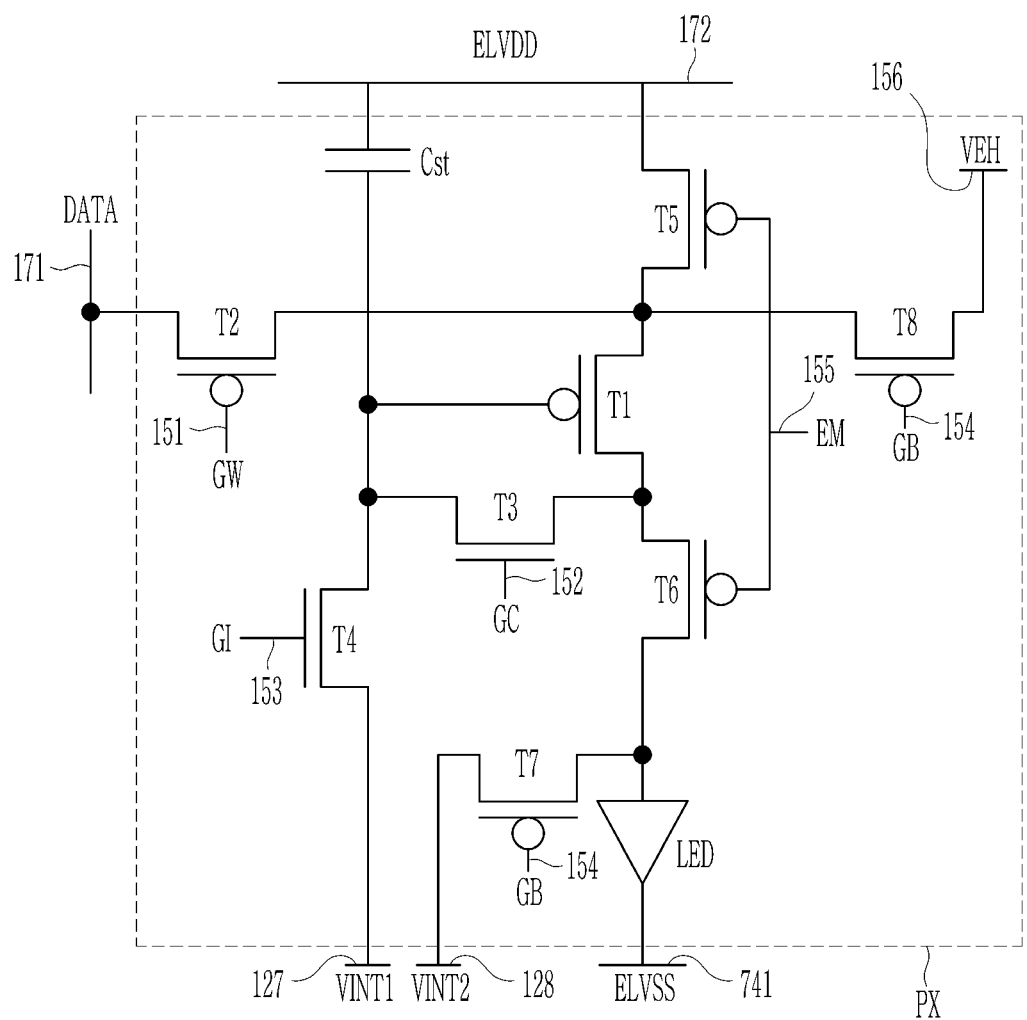
FIG. 5B is a circuit diagram of a representative pixel of the display panel of FIG. 1.

Hereinafter, the display area DA included in the display panel DP is described with reference to FIGS. 5A and 5B. FIG. 5A is a cross-sectional view of a display panel DP corresponding to a display area, and FIG. 5B is a circuit diagram of one pixel according to an embodiment.

First, the stack structure is described based on the display area DA with reference to FIG. 5A.

The substrate SUB according to an embodiment may include an inorganic insulating material, e.g., glass, or an organic insulating material, e.g., a plastic such as polyimide (PI). The substrate SUB may be a single-layered structure or a multi-layered structure. The substrate SUB may have a structure, which is formed by alternately stacking at least one base layer and at least one inorganic layer. For example, the at least one base layer may include a polymer resin sequentially stacked.

The substrate SUB may have various degrees of flexibility. The substrate SUB may be a rigid substrate or a flexible substrate capable of bending, folding, or rolling.

A buffer film BF may be positioned on the substrate SUB. The buffer film BF blocks impurities from being transferred or infiltrated from the substrate SUB to the upper layers of the buffer film BF (e.g., the semiconductor layer SC), thereby preventing a characteristic degradation of the semiconductor layer SC and reducing a stress. The buffer film BF may include an inorganic insulating material such as a silicon nitride or a silicon oxide, or an organic insulating material. Some or all of the buffer film BF may be omitted.

A semiconductor layer ACT is positioned on the buffer layer BF. The semiconductor layer ACT may include at least one among a polysilicon and an oxide semiconductor. The semiconductor layer ACT includes a channel area C, a first area P, and a second area Q. The first area P and the second area Q are disposed on both sides of the channel area C, respectively. The channel area C may include a semiconductor with a small amount of impurity doped at the lower doping concentration compared to the first area P and the second area Q. The first area P and the second area Q may include a semiconductor doped with a large amount of the impurity doped at the higher doping concentration compared to the channel area C. The semiconductor layer ACT may be made of an oxide semiconductor, and in this case, a separate protective layer may be added to protect the oxide semiconductor material that is vulnerable to external environments such as high temperature.

A first inorganic insulating layer IL1 is disposed on the semiconductor layer ACT. The first inorganic insulating layer IL1 may have a single-layered structure or a multi-layered structure including at least one of a silicon oxide (SiOx), a silicon nitride (SiNx), and a silicon oxynitride (SiOxNy).

This specification describes an embodiment in which the first inorganic insulating layer IL1 overlaps the entire surface of the substrate SUB, but embodiments are not limited thereto, and may have the same edge as the gate electrode GE and the first capacitor electrode CE1 to be described later.

A gate electrode GE and a first capacitor electrode CE1 are positioned on the first inorganic insulating layer IL1. The gate electrode GE and the first capacitor electrode CE1 may have a single-layered structure or a multi-layered structure in which a metal film including any one of copper (Cu), a copper alloy, aluminum (Al), an aluminum alloy, molybdenum (Mo), and a molybdenum alloy is stacked. The gate electrode GE may overlap the channel area C of the semiconductor layer ACT.

A second inorganic insulating layer IL2 is positioned on the gate electrode GE and the first inorganic insulating layer IL1. The second inorganic insulating layer IL2 may have a single-layered structure or a multi-layered structure including at least one of a silicon oxide (SiOx), a silicon nitride (SiNx), and a silicon oxynitride (SiOxNy).

An upper electrode UE and a second capacitor electrode CE2 are positioned on the second inorganic insulating layer IL2. The second capacitor electrode CE2 and the upper electrode UE may be different parts formed from one conductive pattern. Alternatively, the second capacitor electrode CE2 and the upper electrode UE may be electrically connected.

The second capacitor electrode CE2 and the upper electrode UE may be a single-layer or multi-layer in which a metal film including any one of copper (Cu), a copper alloy, aluminum (Al), an aluminum alloy, molybdenum (Mo), and a molybdenum alloy is stacked.

A third inorganic insulating layer IL3 is positioned on the upper electrode UE and the second capacitor electrode CE2. The third inorganic insulating layer IL3 may be a single layer or multi-layer including at least one of a silicon oxide (SiOx), a silicon nitride (SiNx), and a silicon oxynitride (SiOxNy).

A source electrode SE and a drain electrode DE are positioned on the third inorganic insulating layer IL3. The source electrode SE and the drain electrode DE are connected to the first area P and the second area Q of the semiconductor layer ACT through contact holes formed in the third inorganic insulating layer IL3, and the first and second inorganic insulating layers IL1 and IL2, respectively.

The source electrode SE and the drain electrode DE may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), etc., and may be a single-layered structure or a multi-layered structure.

A first organic insulating layer IL4 and a second organic insulating layer IL5 are sequentially positioned on the third inorganic insulating layer IL3, the source electrode SE, and the drain electrode DE. The first organic insulating layer IL4 and the second organic insulating layer IL5 may include an organic insulating material such as a generally-used polymer such as polymethyl methacrylate (PMMA) or polystyrene (PS), a polymer derivative having a phenol-based group, an acryl-based polymer, an imide-based polymer, a polyimide, an acryl-based polymer, and a siloxane-based polymer.

A connecting member CE may be positioned between the first organic insulating layer IL4 and the second organic insulating layer IL5. The connecting member CE may connect the drain electrode DE and the first electrode E1. However, embodiments are not limited thereto, and the drain electrode DE and the first electrode E1 may be directly connected without a connecting member according to an embodiment.

The first electrode E is positioned on the second organic insulating layer IL5. The first electrode E1 is connected to the connecting member CE through the contact hole in the second organic insulating layer IL5. The first electrode E1 is electrically connected to the drain electrode DE.

The first electrode E1 may include metals such as silver (Ag), lithium (Li), calcium (Ca), aluminum (Al), magnesium (Mg), and gold (Au), and it may also include a transparent conductive oxide (TCO) such as indium tin oxide (ITO) and indium zinc oxide (IZO). The first electrode E1 may consist of a single layer containing a metal material or a transparent conductive oxide, or a multilayer containing them. For example, the first electrode E1 may have a triple-layer structure of indium tin oxide (ITO)/silver (Ag)/indium tin oxide (ITO).

The transistor consisting of the gate electrode GE, the semiconductor layer ACT, the source electrode SE, and the drain electrode DE is connected to the first electrode E1 to supply a current to the light emitting element ED.

A pixel definition layer IL6 and a spacer IL7 are positioned on the second organic insulating layer IL5 and the first electrode E1.

The pixel definition layer IL6 overlaps at least a portion of the first electrode E1 and has an opening defining the light emitting area. The opening may have a planar shape similar to that of the first electrode E1. The opening may have a rhombus or octagonal shape similar to the rhombus in a plan view, but is not limited thereto, and may have any shape such as a quadrangle, a polygon, a circle, or an ellipse.

The pixel definition layer IL6 and the spacer IL7 may include an organic insulating material such as a generally-used polymer such as polymethyl methacrylate (PMMA) or polystyrene (PS), a polymer derivative having a phenol-based group, an acryl-based polymer, an imide-based polymer, a polyimide, an acryl-based polymer, and a siloxane-based polymer.

The intermediate layer EL is positioned on the first electrode E1 overlapping the opening. The intermediate layer EL according to an embodiment may include an emission layer and a functional layer.

The intermediate layer EL may generate a predetermined colored light. In the description, the intermediate layer EL is shown to be positioned in the display area DA and the peripheral area LA, but at least some of the intermediate layer EL may be positioned only in the display area DA and not in the peripheral area LA. For example, the emission layer may be formed to be positioned only within the opening of the pixel definition layer IL6 by using a mask. For example, the emission layer is positioned in the display area DA and not in the peripheral area LA. The functional layer may be positioned in the display area DA and the peripheral area LA.

The emission layer may include an organic material and/or an inorganic material. Also, the functional layer may include at least one among a hole injection layer (HIL), a hole transporting layer (HTL), an electron transporting layer (ETL), and an electron injection layer (EIL). The functional layer may be positioned between the first electrode E1 and the emission layer, or may be positioned between the emission layer and the second electrode E2. The functional layer may have a shape overlapping the entire surface of the substrate SUB. The functional layer may be disposed over a plurality of pixels.

This specification describes a form in which the intermediate layer EL overlaps the entire surface of the substrate SUB, which shows an embodiment in which the functional layer overlaps the entire surface of the substrate SUB. For example, the emission layer may be formed only within the opening of the pixel definition layer IL6 as described above.

The second electrode E2 is positioned on the intermediate layer EL. The second electrode E2 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), etc., or a transparent conductive oxide (TCO) such as indium tin oxide (ITO) and indium zinc oxide (IZO).

The first electrode E1, the intermediate layer EL, and the second electrode E2 may constitute the light emitting element ED. Here, the first electrode E1 may be an anode, which is a hole injection electrode, and the second electrode E2, may be a cathode, which is an electron injection electrode. However, in an embodiment, according to the driving method of the emissive display device, the first electrode E1 may be the cathode and the second electrode E2 may be the anode.

Holes and electrons are injected into the organic intermediate layer EL from the first electrode E1 and the second electrode E2, respectively, and light emission occurs when an exciton, of which the injected hole and electron are combined, falls from an excited state to a ground state.

An encapsulation layer ENC is positioned on the second electrode E2. The encapsulation layer ENC may cover the side of the light emitting element ED as well as the upper surface, thereby sealing the light emitting element ED. As the light emitting element is damaged by moisture and oxygen, the encapsulation layer ENC seals the light emitting element ED to block the inflow or infiltration of moisture and oxygen from the outside.

The encapsulation layer ENC may include a plurality of layers and may be formed of a composite film including both an inorganic layer and an organic layer. For example, the encapsulation layer ENC may be formed of a triple layer in which a first encapsulation inorganic layer EIL1, an encapsulation organic layer EOL, and a second encapsulation inorganic layer EIL2 are sequentially formed.

The first encapsulation inorganic layer EIL1 may cover the second electrode E2. The first encapsulation inorganic layer EIL1 may prevent external moisture or oxygen from penetrating into the light emitting element ED. For example, the first encapsulation inorganic layer EIL1 may include a silicon nitride, a silicon oxide, or a combination compound thereof. The first encapsulation inorganic layer EIL1 may be formed through a deposition process.

The encapsulation organic layer EOL is disposed on the first encapsulation inorganic layer EIL1 and may be in contact with the first encapsulation inorganic layer EIL1. A curved surface or uneven surface formed on the upper surface of the first encapsulation inorganic layer EIL1 or particles on the first encapsulation inorganic layer EIL1 are covered by the encapsulation organic layer EOL, so that the upper surface of the encapsulation organic layer EOL is substantially flat. Thus, it is possible to prevent the components formed on the encapsulation organic layer EOL from being affected by the uneven upper surface of the first encapsulation inorganic layer EIL1 or the particles on the first encapsulation inorganic layer EIL1. In addition, the encapsulation organic layer EOL may reduce the stress between contacting layers. The encapsulation organic layer EOL may include an organic material, and may be formed through a solution process such as a spin coating process, a slit coating process, or an inkjet process.

The second encapsulation inorganic layer EIL2 is disposed on the encapsulation organic layer EOL to cover the encapsulation organic layer EOL. The second encapsulation inorganic layer EIL2 may be stably formed on a relatively flat surface rather than being disposed on the first encapsulation inorganic layer EIL1. The second encapsulation inorganic layer EIL2 may encapsulate the encapsulation organic layer EOL to prevent moisture from being inflowed or infiltrated into the encapsulation organic layer EOL from the outside. The second encapsulation inorganic layer EIL2 may include a silicon nitride, a silicon oxide, or a combination compound thereof. The second encapsulation inorganic layer EIL2 may be formed through a deposition process.

For example, a capping layer positioned between the second electrode E2 and the encapsulation layer ENC may be further included. The capping layer may include an organic material. The capping layer protects the second electrode E2 from a subsequent process, e.g., a sputtering process, and improves light emission efficiency of the light emitting element ED. The capping layer may have a refractive index greater than that of the first encapsulation inorganic layer EIL1.

Although one of the transistors included in one pixel has been described above, each pixel may include a plurality of transistors. Next, examples of a plurality of transistors included in each pixel are described with reference to FIG. 5B As shown in FIG. 5B, one pixel PX of a display device according to an embodiment includes a plurality of transistors, a storage capacitor Cst, and a light emitting diode (LED), which are connected to several wires 127, 128, 151, 152, 153, 154, 155, 171, 172, and 741. For example, the plurality of transistors may include a first transistor in the form of a driving transistor T1, a second transistor T2, a third transistor T3, a fourth transistor T4, a fifth transistor T5, a sixth transistor T6, and a seventh transistor T7.

The plurality of wires 127, 128, 151, 152, 153, 154, 155, 171, 172, and 741 are connected to one pixel PX. The plurality of wires include a first initialization voltage line 127, a second initialization voltage line 128, a first scan signal line 151, a second scan signal line 152, an initialization control line 153, a bypass control line 154, a light emission control line 155, a data line 171, a driving voltage line 172, and a common voltage line 741.

The first scan signal line 151 is connected to a gate driver and transmits the first scan signal GW to the second transistor T2. A voltage of the opposite polarity to the voltage applied to the first scan signal line 151 may be applied to the second scan signal line 152 at the same timing as the signal of the first scan signal line 151. For example, when a negative voltage is applied to the first scan signal line 151, a positive voltage may be applied to the second scan signal line 152. The second scan signal line 152 transmits the second scan signal GC to the third transistor T3.

The initialization control line 153 transmits an initialization control signal GI to the fourth transistor T4. The bypass control line 154 transmits a bypass signal GB to the seventh transistor T7. The bypass control line 154 may be formed of the first scan signal line 151 of the previous stage. The light emission control line 155 transmits a light emission control signal EM to the fifth transistor T5 and the sixth transistor T6.

The data line 171 is a wire that transmits a data voltage DATA generated from a data driver, and the luminance generated by the light emitting diode (LED) is changed according to the data voltage DATA applied to the pixel PX.

The driving voltage line 172 applies the driving voltage ELVDD. The first initialization voltage line 127 transmits a first initialization voltage VINT1, and the second initialization voltage line 128 transmits a second initialization voltage VINT2. The common voltage line 741 applies the common voltage ELVSS to the cathode of the light emitting diode LED. In an embodiment, the voltages applied to the driving voltage line 172, the first and second initialization voltage lines 127 and 128, and the common voltage line 741 may be substantially constant voltages, respectively.

A plurality of transistors may include an oxide transistor including an oxide semiconductor and a silicon transistor including a polycrystalline silicon semiconductor. For example, the third transistor T3 and the fourth transistor T4 may be made of the oxide transistors, and the driving transistor T1, the second transistor T2, the fifth transistor T5, the sixth transistor T6, and the seventh transistor T7 may be made of the silicon transistors. However, embodiments are not limited thereto, and a plurality of transistors may all be formed of the silicon transistors.

In the above, it has been described that one pixel PX includes seven transistors T1, T2, T3, T4, T5, T6, and T7, one storage capacitor Cst, and a light emitting diode (LED), but embodiments are not limited thereto, and the number of transistors and capacitors and their connection relationships may be changed in many ways.

Figure 6:
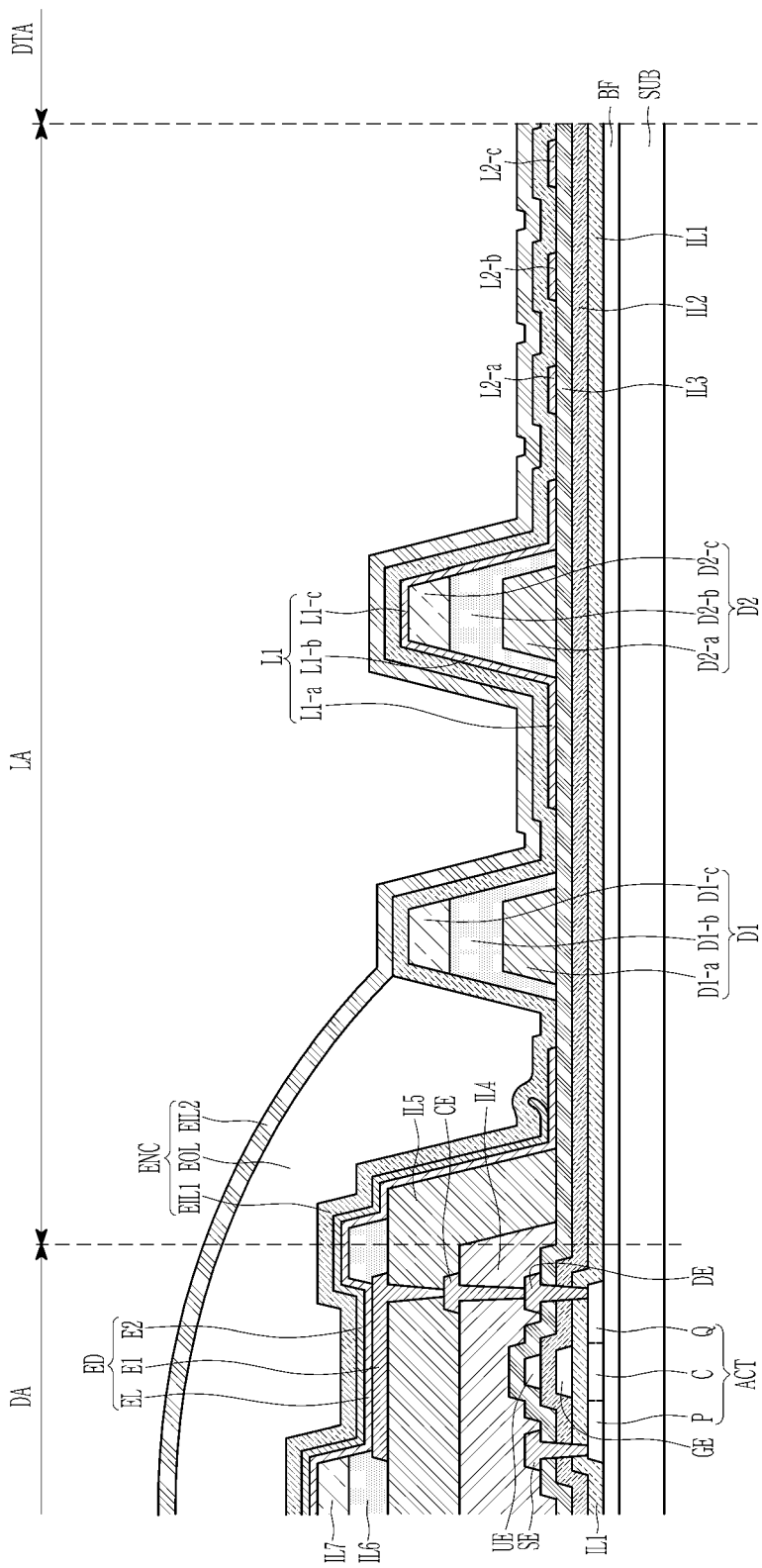
FIGS. 6, 7, 8, 9, and 10 are cross-sectional views of other embodiments of the display panel of FIG. 1, respectively.

Next, the cross-section view of the display panel DP disposed in the peripheral area according to an embodiment is described with reference to FIG. 6. FIG. 6 is a cross-sectional view of a peripheral area according to an embodiment. The description of the same constituent elements as in the above description is omitted.

First, in the peripheral area LA, the buffer layer BF, the first inorganic insulating layer IL1, the second inorganic insulating layer IL2, and the third inorganic insulating layer IL3 may be disposed on the substrate SUB. The buffer layer BF, the first inorganic insulating layer IL1, the second inorganic insulating layer IL2, and the third inorganic insulating layer IL3 may extend from the display area DA. The specification describes an embodiment in which the buffer layer BF, the first inorganic insulating layer IL1, the second inorganic insulating layer IL2, and the third inorganic insulating layer IL3 are extended to the peripheral area LA, however embodiments are not limited thereto, and may be modified in various shapes in which at least one of the buffer layer BF, the first inorganic insulating layer IL1, the second inorganic insulating layer IL2, and the third inorganic insulating layer IL3 is extended to the peripheral area LA.

At least two dams D1 and D2 may be positioned in the peripheral area LA. For example, a first dam D1 and a second dam D2 may be positioned in the order adjacent to the display area DA. The first dam D1 and the second dam D2 may be positioned in the peripheral area LA and may be positioned on the third inorganic insulating layer IL3.

The first dam D1 may include a first-first sub-dam D1-*a*, a first-second sub-dam D1-*b*, and a first-third sub-dam D1-*c*. The first-first sub-dam D1-*a* disposed in the peripheral area LA and the second organic insulating layer IL5 disposed in the display area DA may be positioned on the same layer, and may include the same material. For example, the first-first sub-dam D1-*a* in the peripheral area LA and the second organic insulating layer IL5 may be formed of the same material. The first-first sub-dam D1-*a* may be formed in the same process as that of forming the second organic insulating layer IL5 positioned in the display area DA. The first-second sub-dam D1-*b* may include the same material as that of the pixel definition layer IL6 positioned in the display area DA. The first-second sub-dam D1-*b* may be formed in the same process as that of forming the pixel definition layer IL6 positioned in the display area DA. For example, the first-second sub-dam D1-*b* and the pixel definition layer IL6 may be formed of the same material. The first-third sub-dam D1-*c* may include the same material as that of the spacer IL7 disposed in the display area DA. For example, the first-third sub-dam D1-*c* and the spacer IL7 may be formed of the same material. The first-third sub-dam D1-*c* may be formed in the same process as that of forming the spacer IL7 positioned in the display area DA. However, the first dam D1 may not be limited to this material and position.

The second dam D2 may include a second-first sub-dam D2-*a*, a second-second sub-dam D2-*b*, and a second-third sub-dam D2-*c*. The second-first sub-dam D2-*a* disposed in the peripheral area LA may include the same material as that of the second organic insulating layer IL5 disposed in the display area DA. For example, the second-first sub-dam D2-*a* and the second organic insulating layer IL5 may be formed of the same material. The second-first sub-dam D2-*a* may be formed in the same process as that of forming the second organic insulating layer IL5 disposed in the display area DA. The second-second sub-dam D2-*b* may include the same material as that of the pixel definition layer IL6 disposed in the display area DA. For example, the second-second sub-dam D2-*b* and the pixel definition layer IL6 may be formed of the same material. The second-second sub-dam D2-*b* may be formed in the same process as that of forming the pixel definition layer IL6 disposed in the display area DA. The second-third sub-dam D2-*c* may be formed in the same process as that of forming the spacer IL7 disposed in the display area DA. For example, the second-third sub-dam D2-*c* and the spacer IL7 may be formed of the same material. The second-third sub-dam D2-*c* may be formed in the same process as that of forming the spacer IL7 disposed in the display area DA. However, the second dam D2 may not be limited to these materials and layers.

The specification describes an embodiment in which the first dam D1 and the second dam D2 are formed in a triple-layer structure. However, embodiments are not limited thereto, and as an example, various shape changes in which the stacked shape is deformed may be possible like the first dam D1 being formed in a triple-layer structure and the second dam D2 being formed in a quadruple-layer structure. In addition, although this specification describes an embodiment in which two dams D1 and D2 are positioned in the peripheral area LA, the number of the dams is not limited thereto. For example, two or more dams may be positioned in the peripheral area LA.

For example, the first and second dams D1 and D2, as shown in FIG. 4, have a ring shape surrounding the opening area DTA in a plan view. For example, the size (e.g., the diameter) of the first dam D1 is smaller than the size (e.g., the diameter) of the second dam D2. However, this is an example of the shape, and the first dam D1 and second dam D2 may have a different shape from the opening area DTA. For example, the first dam D1 and the second dam D2 may have a shape including a polygon, an ellipse, or a closed line shape including at least some curved lines, or may be provided in a shape including a plurality of patterns that are partially disconnected, and embodiments are not limited thereto.

The intermediate layer EL may extend from the display area DA to a portion of the peripheral area LA. The second electrode E2 positioned on the intermediate layer EL may extend from the display area DA to a portion of the peripheral area LA. The end of the second electrode E2 may be formed in a shape including a burr. The second electrode E2 having a fairly thin thickness may have a shape in which the end of the second electrode E2 is rolled up by heat transferred from the laser.

Except for a portion of the second electrode E2 extending from the display area DA to the peripheral area LA, any layer, which is formed of the same material as that of the second electrode E2, may not be disposed in the peripheral area LA.

In the peripheral area LA, the first layer L1 (i.e., L1-*a*, L1-*b*, and L1-*c*) and the second layers L2-*a*, L2-*b*, and L2-*c* may be disposed. The first layer L1 and the second layers L2-*a*, L2-*b*, and L2-*c* may include the same material as that of at least a part of the intermediate layer EL. For example, the first layer L1 and the second layers L2-*a*, L2-*b*, and L2-*c* may be formed of the same material. The first layer L1 and the second layers L2-*a*, L2-*b*, and L2-*c* may include at least one of a plurality of functional layers included in the intermediate layer EL and the emission layer. The first layer L1 and the second layers L2-a, L2-b, and L2-c may include at least one of the hole transport layer, the hole injection layer, the electron transport layer, and the electron injection layer included in the functional layer. The first layer L1 and the second layer L2-a, L2-b, and L2-c may be formed in the same process as that of forming the intermediate layer EL.

The first layer L1 may overlap the second dam D2. The first layer L1 may cover the side and upper surfaces of the second dam D2. The first layer L1 may be in contact with the side and upper surfaces of the second dam D2.

The first layer L1 may include a first portion L1-a, a second portion L1-b, and a third portion L1-c. For example, the first portion L1-a may be disposed between the first dam D1 and the second dam D2 or between the second dam D2 and the opening area DTA. The second portion L1-b may overlap the side surface of the second dam D2. The third portion L1-c may overlap the upper surface of the second dam D2. The first portion L1-a may have a shape extending from the second portion L1-b. The first portion L1-a may be positioned on the third inorganic insulating layer IL3 according to an embodiment. The length of the first portion L1-a may be increased or decreased according to an embodiment. The second portion L1-b may be in contact with the side of the second dam D2. The third portion L1-c may be in contact with the upper surface of the second dam D2.

A plurality of second layers L2-a, L2-b, and L2-c may be disposed between the second dam D2 and the opening area DTA. The second layers L2-a, L2-b, and L2-c may be disposed on the third inorganic insulating layer IL3, but embodiments are not limited thereto, and may be positioned on one inorganic insulating layer according to the stacked structure of the peripheral area LA. A plurality of second layers L2-a, L2-b, and L2-c may be spaced apart from each other. This specification describes a configuration in which three second layers L2-a, L2-b, and L2-c are disposed in the peripheral area LA, but embodiments are not limited thereto, and at least one or more second layers may be disposed in the peripheral area LA. Further, according to an embodiment, the second layers L2-a, L2-b, and L2-c may be omitted.

In the peripheral area LA according to an embodiment, the end of the intermediate layer EL and the first layer L1 and a plurality of second layers L2-a, L2-b, and L2-c, extending from the display area DA and formed in the same process, may be disposed. The end of the intermediate layer EL and the first layer L1 and a plurality of second layers L2-a, L2-b, and L2-c may be spaced apart from each other, e.g., in a plan view.

According to an embodiment, the intermediate layer EL and the first layer L1 may have a disconnected shape via the first dam D1 interposed therebetween. The first layer L1 and a plurality of second layers L2-a, L2-b, and L2-c may have a shape that is cut off between the second dam D2 and the opening area DTA. The first layer L1 and a plurality of second layers L2-a, L2-b, and L2-c may have a shape that is cut off between the second dam D2 and the opening area DTA. Moisture and/or foreign particles may move along the intermediate layer EL, the first layer L1 and the second layers L2-a, L2-b, and L2-c including the organic material. However, the intermediate layer EL, the first layer L1 and the second layers L2-a, L2-b, and L2-c according to an embodiment have the disconnected shape. Thus, it may prevent the inflow of moisture and/or foreign particles to the display area DA by blocking the path, in which the moisture and/or the foreign particles move.

For example, the first encapsulation inorganic layer EIL1 covering the end of the second electrode E2, the encapsulation organic layer EOL, and the second encapsulation inorganic layer EIL2 positioned on the first encapsulation inorganic layer EIL1 may be stacked between the end of the display area DA and the first dam D1 positioned in the peripheral area LA. For example, the first encapsulation inorganic layer EIL1 and the second encapsulation inorganic layer EIL2 may be stacked between the first dam D1 and the opening area DTA.

The first encapsulation inorganic layer EIL1 may be in contact with the side and upper surfaces of the first dam D1. The first encapsulation inorganic layer EIL1 may be in contact with the first layer L1 positioned on the second dam D2. The first encapsulation inorganic layer EIL1 may be in contact with a plurality of second layers L2-a, L2-b, and L2-c. The second encapsulation inorganic layer EIL2 may be disposed directly on the first encapsulation inorganic layer EIL1 between the first dam D1 and the opening area DTA. The first encapsulation inorganic layer EIL1 and the second encapsulation inorganic layer EIL2 may be in contact with each other between the first dam D1 and the opening area DTA.

Since the side of the first dam D1 according to an embodiment is covered by the first encapsulation inorganic layer EIL1, it is possible to prevent moisture or foreign substance from flowing into the display area DA through the side of the first dam D1.

The opening area DTA may be equipped with the first electronic module described above. The inner surface of the opening area DTA may be defined by the ends of the substrate SUB, the buffer layer BF, the first inorganic insulating layer IL1, the second inorganic insulating layer IL2, the third inorganic insulating layer IL3, the first encapsulation inorganic layer EIL1, and the second encapsulation inorganic layer EIL2. The ends of the substrate SUB, the buffer layer BF, the first inorganic insulating layer IL1, the second inorganic insulating layer IL2, the third inorganic insulating layer IL3, the first encapsulation inorganic layer EIL1, and the second encapsulation inorganic layer EIL2 are aligned with each other to form the opening area DTA. According to an embodiment, at least one of the buffer layer BF, the first inorganic insulating layer IL1, the second inorganic insulating layer IL2, and the third inorganic insulating layer IL3 may be omitted.

According to an embodiment, the area, in which the layers including the same material as that of the intermediate layer are disconnected, may be positioned on the side and upper surfaces of the first dam D1, as well as on the third inorganic insulating layer IL3. When the areas, in which the layers including the same material as that of the intermediate layer are disconnected, are positioned only on the third inorganic insulating layer IL3, it is positioned between the first and second dams D1 and D2, or between the second dam D2 and the opening area DTA to block the penetration path. According to an embodiment, the distance between the first and second dams D1 and D2 increases, or the distance between the second dam D2 and the opening area DTA increases, thereby increasing the area occupied by the peripheral area LA. However, according to an embodiment, since the area for blocking the permeation path is also positioned on the side and upper surfaces of the first dam D1, the area of the peripheral area LA, e.g., the dead space, may be reduced. In addition, as the inorganic encapsulation layer is immediately disposed on the side or upper surfaces of the first dam D1 or the second dam D2, re-adsorption or re-inflow of foreign particles may be prevented, and the permeation path of moisture or foreign substance may be blocked.

Next, the cross-section of the display panel DP according to an embodiment is described with reference to FIGS. 7, 8, 9, and 10. FIGS. 7, 8, 9, and 10 are cross-sectional views of a display panel DP according to an embodiment, respectively.

Figure 7:
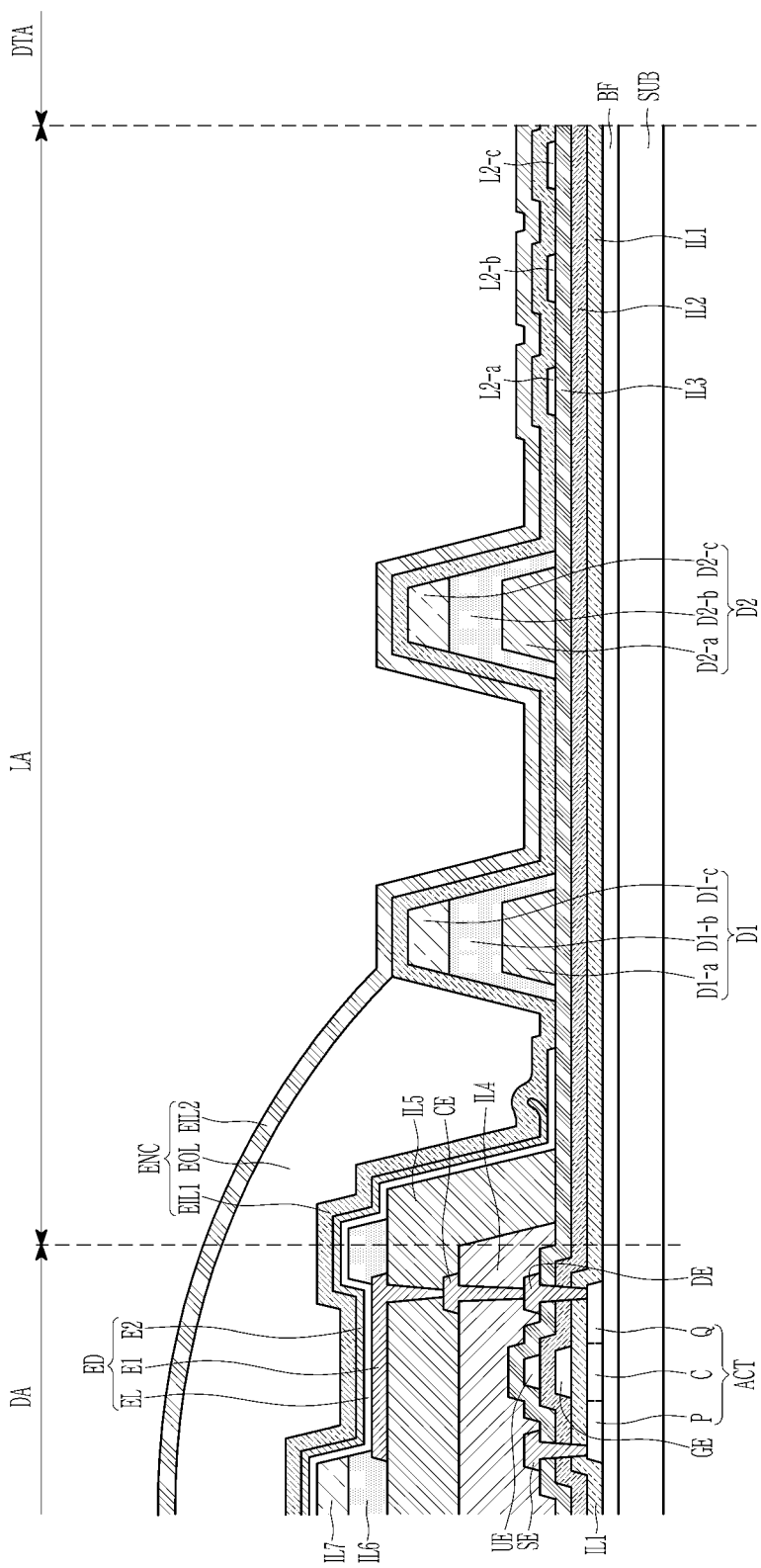

Referring to FIG. 7, the display device according to an embodiment may include a plurality of second layers L2-a, L2-b, and L2-c disposed in the peripheral area LA. A plurality of second layers L2-a, L2-b, and L2-c may include the same material as that of at least a part of the intermediate layer EL. For example, the plurality of second layers L2-a, L2-b, and L2-c and the intermediate layer EL may be formed of the same material. A plurality of second layers L2-a, L2-b and L2-c may be simultaneously formed in the process of forming the intermediate layer EL. The layer including the same material as that of the intermediate layer EL is not formed on the first dam D1 and the second dam D2. The layer including the same material as that of the intermediate layer EL may have the disconnected shape from the first dam D1 to the second dam D2. For example, the plurality of second layers L2-a, L2-b, and L2-c may extend along the inner surface of the opening area DTA in a plan view. The plurality of second layers L2-a, L2-b, and L2-c may have closed line shapes (e.g., a ring, a polygon, or, and ellipse) having the different sizes (e.g., diameters) from each other in a plan view. Alternatively, the plurality of second layers L2-a, L2-b, and L2-c may have shapes including a plurality of patterns that are partially disconnected from each other in a plan view. According to an embodiment, a plurality of second layers L2-a, L2-b, and L2-c may also be omitted.

The first inorganic encapsulation layer EIL1 may be in contact with the side and upper surfaces of the first dam D1, and the side and upper surfaces of the second dam D2. Also, the first inorganic encapsulation layer EIL1 may be in contact with the third inorganic insulating layer IL3 exposed between the first dam D1 and the second dam D2.

According to an embodiment, both the upper and side surfaces of the dams D1 and D2 are covered by the first inorganic encapsulation layer EIL1, so it is possible to block the path through which moisture or foreign particles penetrate.

Figure 8:
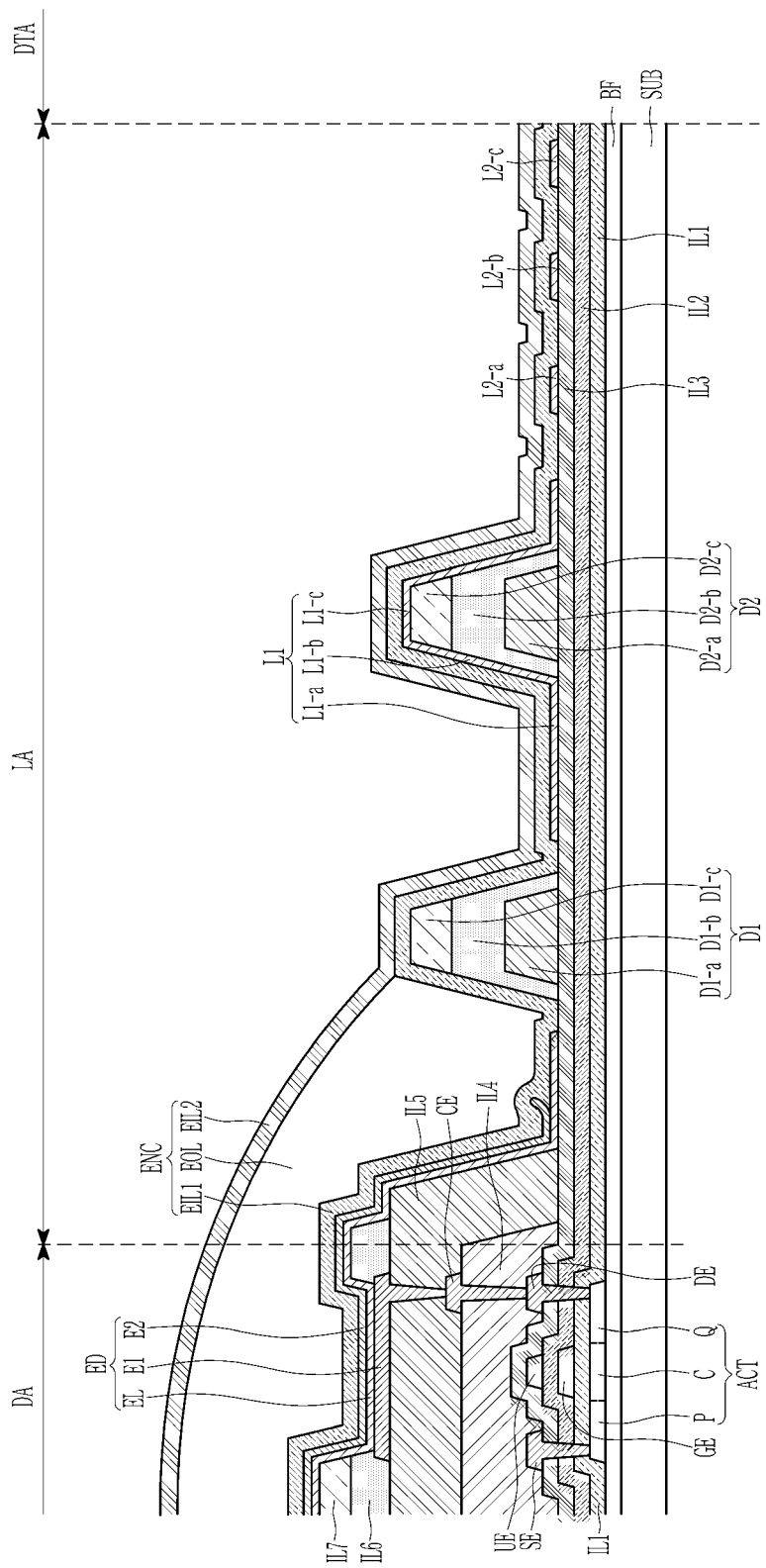

Referring to FIG. 8, the display device according to an embodiment may include the end of the intermediate layer EL and the end of the first layer L1, which extend adjacent to the side of the first dam D1. The first layer L1 may include a first portion L1-a disposed on the third inorganic insulating layer IL3, a second portion L1-b disposed on the side of the second dam D2, and a third portion L1-c disposed on the upper surface of the second dam D2. For example, the first portion L1-a may extend adjacent to the first dam D1. For example, the first layer L1 and the plurality of second layers L2-a, L2-b, and L2-c may extend along the inner surface of the opening area DTA in a plan view. The first layer L1 and the plurality of second layers L2-a, L2-b, and L2-c may have closed line shapes (e.g., a ring, a polygon, or, and ellipse) having the different sizes (e.g., diameters) from each other in a plan view. Alternatively, the first layer L1 and the plurality of second layers L2-a, L2-b, and L2-c may have shapes including a plurality of patterns that are partially disconnected from each other in a plan view. The layer containing the same material as that of the intermediate layer EL may have the disconnected shape on the side and upper surfaces of the first dam D1. The side and upper surfaces of the first dam D1 may be covered with the first encapsulation inorganic layer EIL1. The path, through which moisture or foreign substance penetrates, may be blocked on the side and upper surfaces of the first dam D1.

Figure 9:
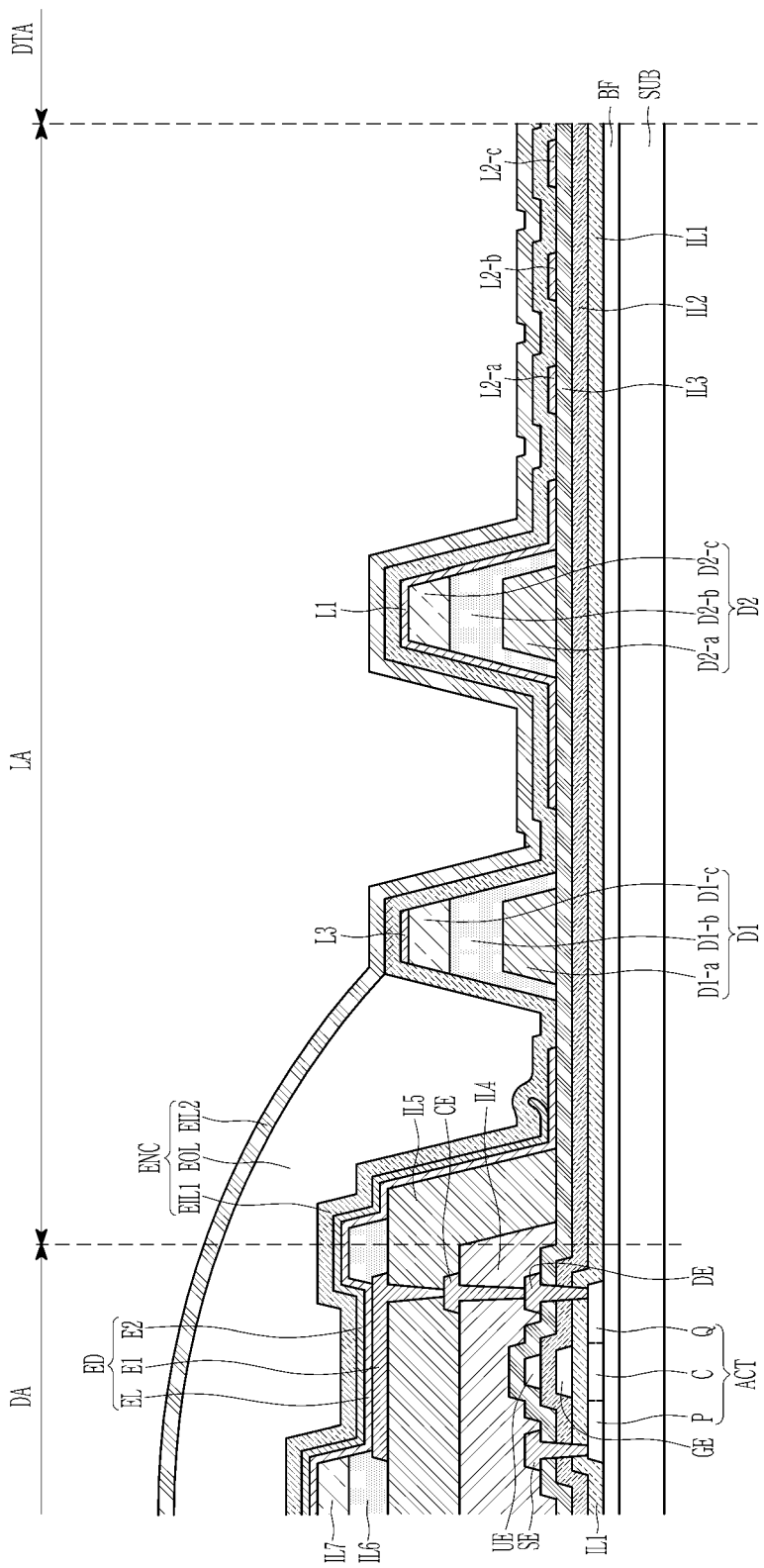

Referring to FIG. 9, the display device according to an embodiment may further include a third layer L3 disposed on the upper surface of the first dam D1. The third layer L3 may have substantially the same edge as the upper surface of the first dam D1. The third layer L3 may include the same material as that of at least a portion of the intermediate layer EL. For example, the third layer L3 and the intermediate layer EL may be formed of the same material. For example, the third layer L3 may include at least one of the hole transport layer, the hole injection layer, the electron transport layer, and the electron injection layer included in the intermediate layer EL. The third layer L3 may be formed in the same process as that of forming the intermediate layer EL. For example, the first layer L1, the plurality of second layers L2-a, L2-b, and L2-c, and the third layer L3 may extend along the inner surface of the opening area DTA in a plan view. The first layer L1, the plurality of second layers L2-a, L2-b, and L2-c, and the third layer L3 may have closed line shapes (e.g., a ring, a polygon, or, and ellipse) having the different sizes (e.g., diameters) from each other in a plan view. Alternatively, the first layer L1, the plurality of second layers L2-a, L2-b, and L2-c, and the third layer L3 may have shapes including a plurality of patterns that are partially disconnected from each other in a plan view.

According to an embodiment, the layer including the same material as that of the intermediate layer EL may have the disconnected shape on the side of the first dam D1, the upper surface of the third inorganic insulating layer IL3 adjacent to the first dam D1, and on the upper surface of the third inorganic insulating layer IL3 between the second dam D2 and the opening area DTA. The path, through which moisture or foreign substance penetrates, may be blocked in a plurality of areas.

Figure 10:
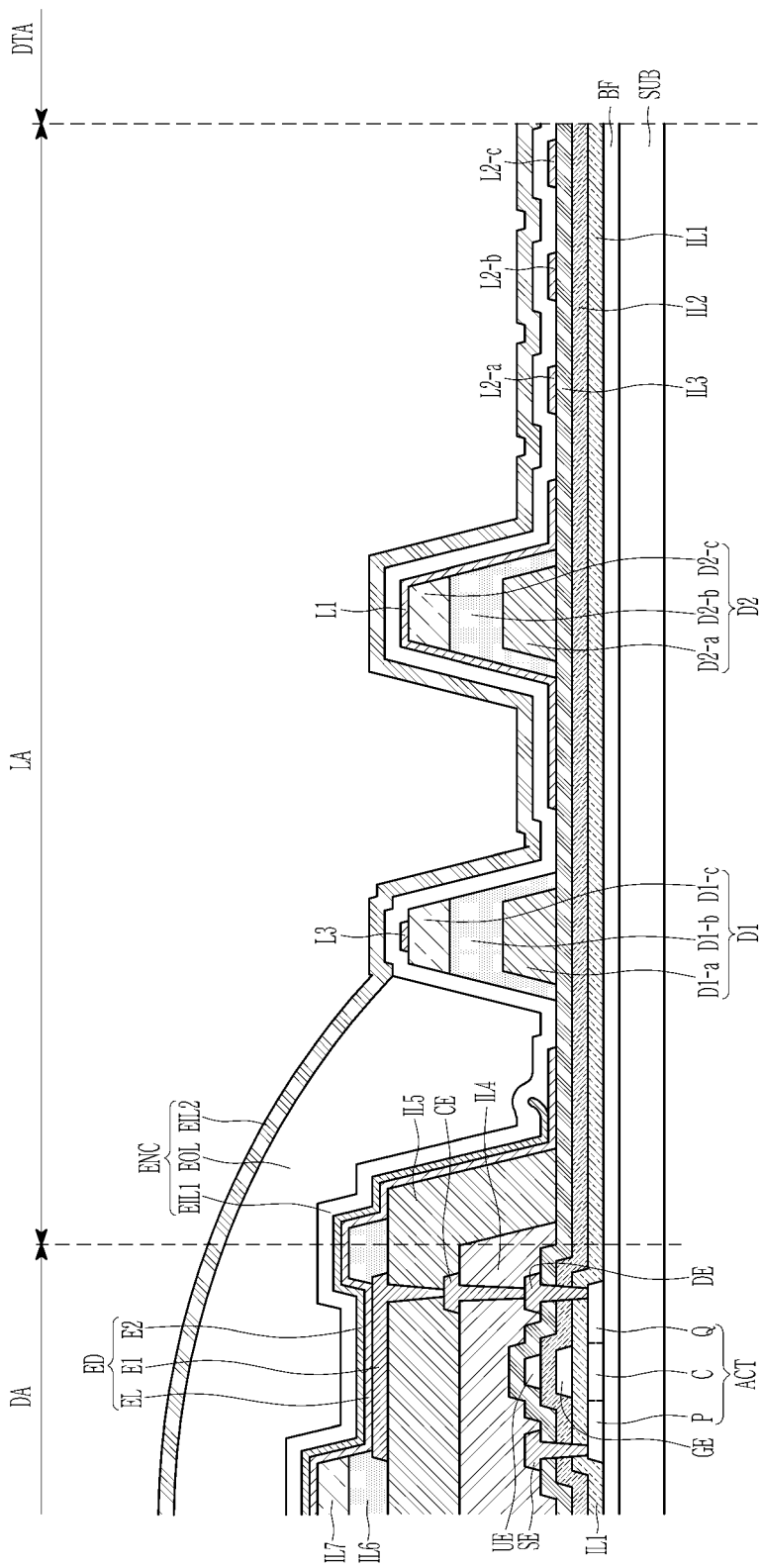

Referring to FIG. 10, the display device according to an embodiment may further include the third layer L3 disposed on the upper surface of the first dam D1. The third layer L3 may include the same material as that of at least a portion of the intermediate layer EL. For example, the third layer L3 and the intermediate layer EL may be formed of the same material. The third layer L3 may be formed in the same process as that of forming the intermediate layer EL.

The size (e.g., area) of the third layer L3 may be smaller than the size (e.g., area) of the upper surface of the first dam D1. A part of the upper surface of first dam D1 may overlap the third layer L3, and the rest of the upper surface of first dam D1 may not overlap the third layer L3 to be exposed.

According to an embodiment, the layer including the same material as that of the intermediate layer EL may have the disconnected shape on the side of the first dam D1, a part of the upper surface of the first dam D1, the upper surface of the third inorganic insulating layer IL3 adjacent to the first dam D1, and the upper surface of the third inorganic insulating layer IL3 between the second dam D2 and the opening area DTA. The path, through which moisture or foreign substance penetrates, may be blocked in a plurality of areas.

Hereinafter, the manufacturing method of the display panel DP according to an embodiment is described with reference to FIGS. 11, 12, 13, 14, and 15. FIGS. 11, 12, 13, 14, and 15 are cross-sectional views of a display panel DP according to a manufacturing process, respectively.

Figure 11:
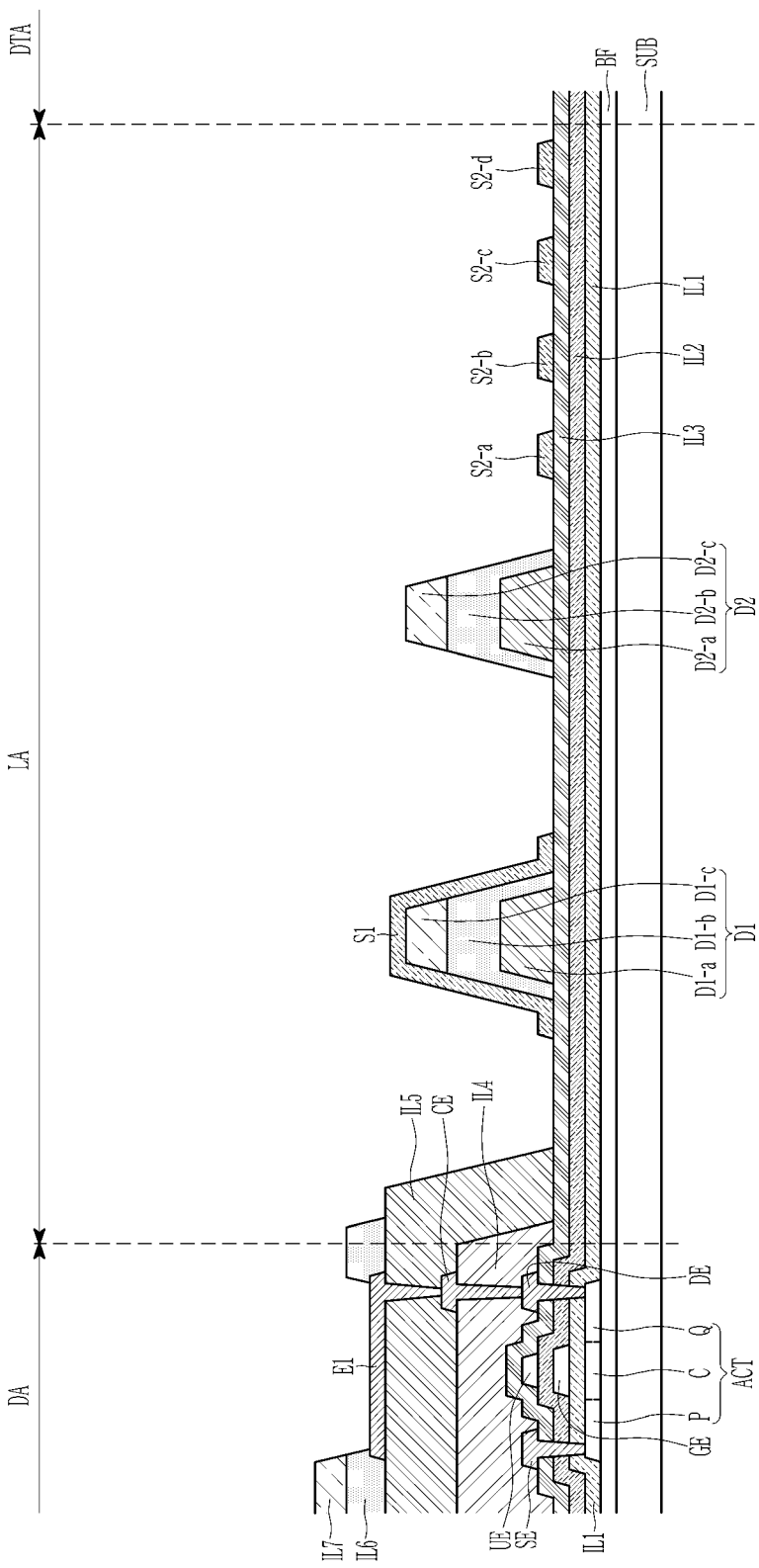
FIGS. 11, 12, 13, 14, and 15 are cross-sectional views of the display panel of FIG. 1 illustrating a manufacturing process, respectively.

First, as shown in FIG. 11, in the display device according to an embodiment, the transistor overlapping the display area DA and disposed on the substrate SUB and the first electrode E1 electrically connected to the transistor are formed. The transistor and the first electrode E1 may be formed by patterning a conductive material.

The pixel definition layer IL6 and the spacer IL7 can be formed on the second organic insulating layer IL5 and the first electrode E1. The pixel definition layer IL6 may be formed to include an opening exposing at least a portion of the first electrode E1. At the same time, a first dam D1 and a second dam D2 may be formed in the peripheral area LA. The first dam D1 and the second dam D2 may be formed in a multi-layered structure including the organic material.

Next, a first sacrificial layer S1 covering the upper surface and side of the first dam D1 and a part of the third inorganic insulating layer IL3 is formed. A plurality of second sacrificial layers S2-$a$, S2-$b$, S2-$c$, and S2-$d$ disposed on the third inorganic insulating layer IL3 are formed.

The first sacrificial layer S1 according to an embodiment may extend to the upper surface of the third inorganic insulating layer IL3 as well as the upper surface and the side surface of the first dam D1. However, the shape of the first sacrificial layer S1 is not limited thereto, and it may be modified in various forms in order to provide the display panel DP according to an embodiment of FIGS. 7, 8, 9, and 10. In order to manufacture the display panel DP according to FIG. 7, the first sacrificial layer S1 may be provided to cover the first dam D1 and the second dam D2. In order to manufacture the display panel DP according to FIG. 8, the first sacrificial layer S1 may be formed to overlap the upper and side surface of the first dam D1. In order to manufacture the display panel DP according to FIG. 9, the first sacrificial layer S1 may have the shape overlapping the side of the first dam D1 and the upper surface of the third inorganic insulating layer IL3. In order to manufacture the display panel DP according to FIG. 10, the first sacrificial layer S1 may have the shape overlapping a part of the upper surface and the side of the first dam D1, and the upper surface of the third inorganic insulating layer IL3.

The first sacrificial layer S1 may overlap the side of the first dam D1. In the process of irradiating a laser to the sacrificial layer, a predetermined foreign substance may be generated. When the side of the first dam D1 is exposed, the foreign substance may be adhered to the side of the first dam D1. When the first encapsulation inorganic layer EIL1 and the second encapsulation inorganic layer EIL2 are deposited on the adhered foreign material, cracks are generated on the first encapsulation inorganic layer EIL1 and the second encapsulation inorganic layer EIL2, which may become a path for moisture or foreign particle permeation. However, according to an embodiment, when the first sacrificial layer S1 overlaps the side of the first dam D1, foreign substances generated in the process of irradiating the laser to the sacrificial layer may be prevented from being adhered to the side of the first dam D1. Thus, the cracks of the first encapsulation inorganic layer EIL1 and/or the second encapsulation inorganic layer EIL2 may be prevented. The permeation path of moisture or foreign particles may thereby be prevented.

Each of the first sacrificial layer S1 and a plurality of second sacrificial layers S2-$a$, S2-$b$, S2-$c$, and S2-$d$ may include a metal material, and for example, it may include any one of silver (Ag), titanium (Ti), and molybdenum (Mo).

Figure 12:
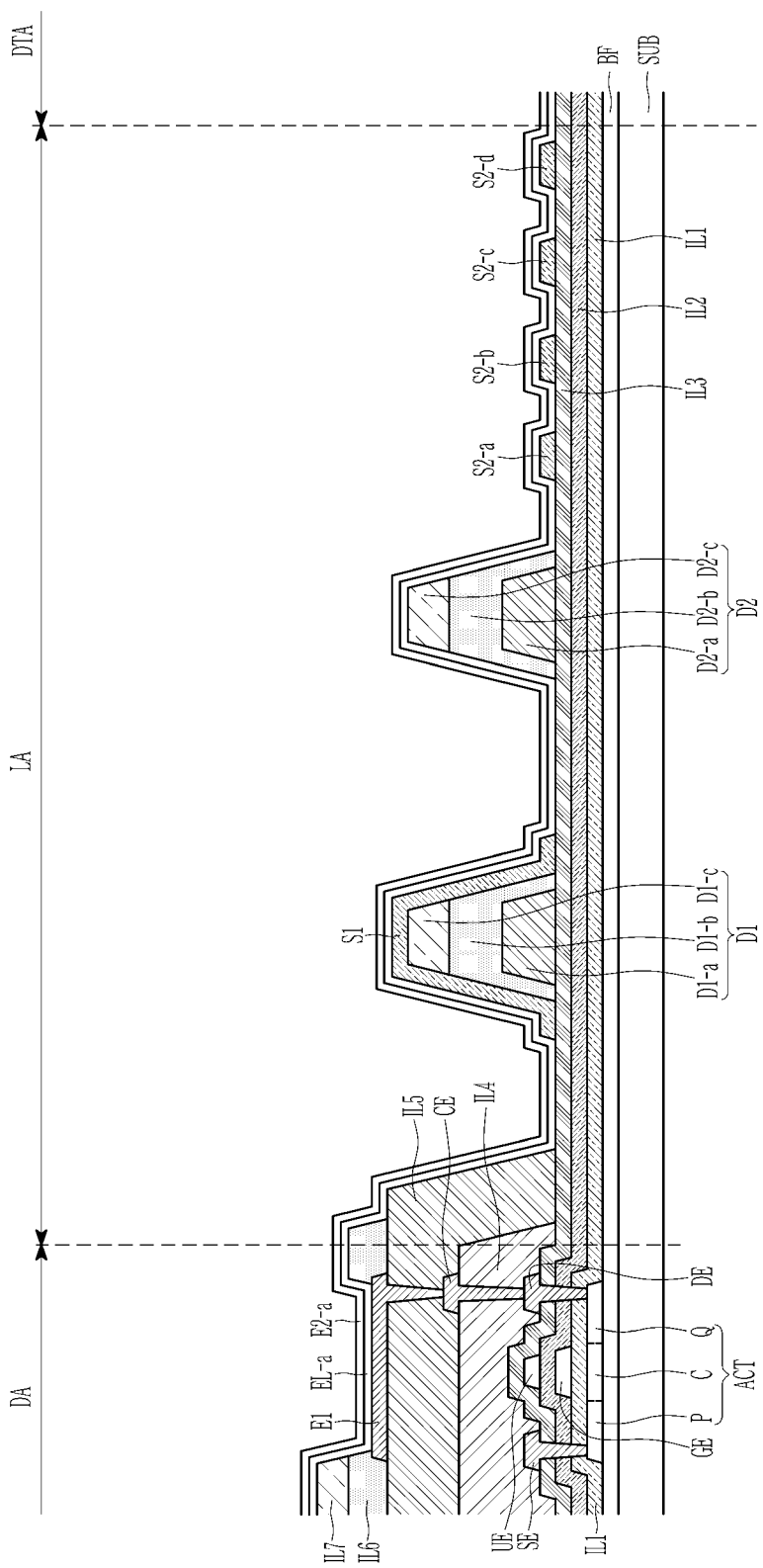

Next, as shown in FIG. 12, an intermediate material layer EL-$a$ and a second electrode material layer E2-$a$ are formed on the substrate SUB by a deposition process.

The intermediate material layer EL-$a$ may include an emission layer formed to be positioned only the opening of the pixel definition layer IL6 by using a mask and a functional material layer formed to overlap the entire surface of the substrate SUB. The functional material layer may include a material layer to form at least one among the hole injection layer (HIL), the hole transporting layer (HTL), the electron transporting layer (ETL), and the electron injection layer (EIL) described above.

For example, in the description, the emission layer positioned only in the opening of the pixel definition layer IL6 is not separately shown, and the intermediate material layer EL-a is shown to overlap the entire surface of the substrate SUB. This means that the functional material layer overlaps the entire surface of the substrate SUB, and the emission layer positioned only in the opening of the pixel definition layer IL6 is omitted.

Figure 13:
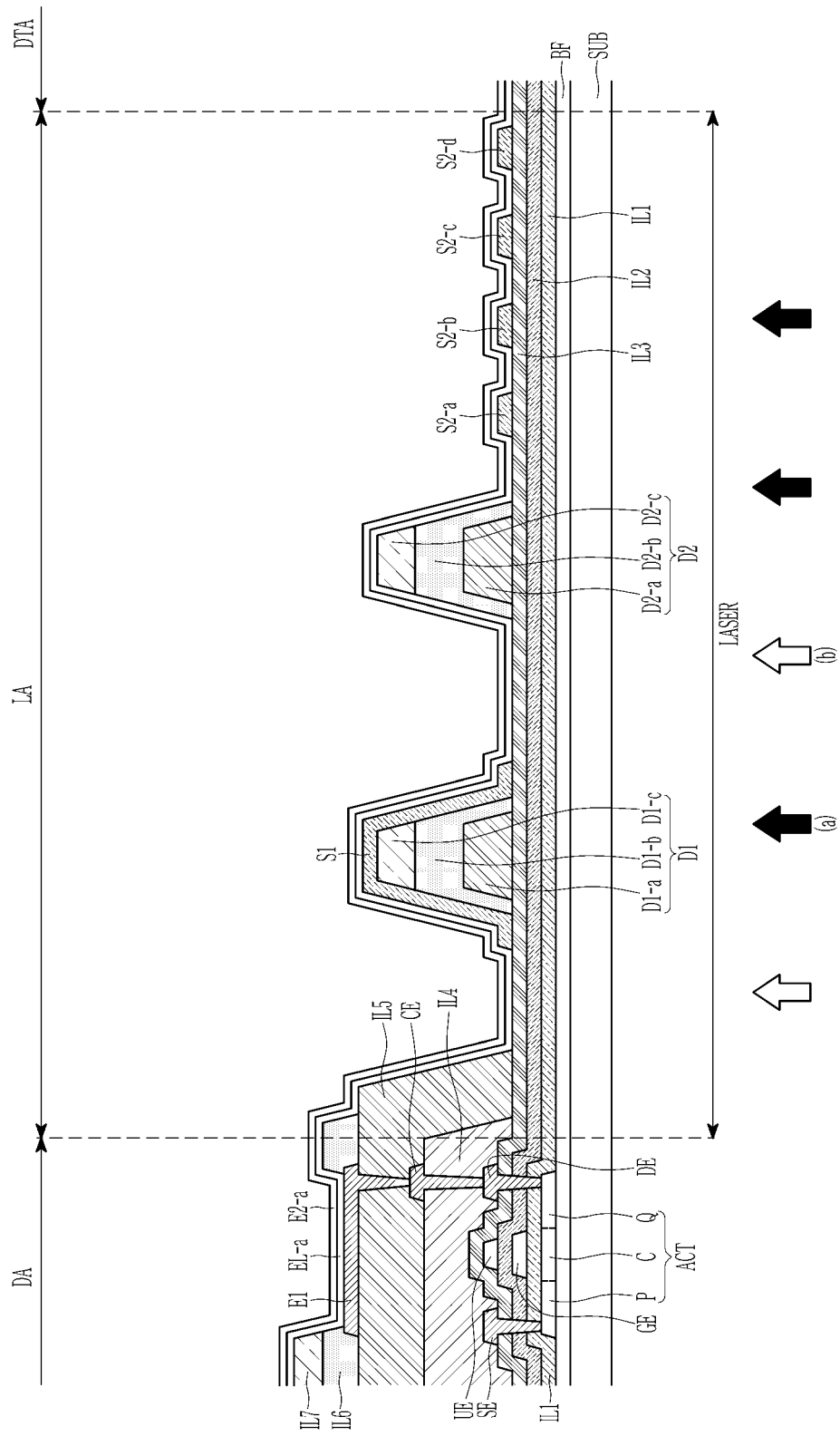

Next, as shown in FIG. 13, a laser LASER is irradiated to a part of the peripheral area LA. The area IRA irradiated by the laser may be irradiated with lasers having different energy densities according to an embodiment. For example, a laser (a) having a high energy density may be irradiated on the area where the sacrificial layers S1, S2-$a$, S2-$b$, S2-$c$, and S2-$d$ are positioned. A laser (b) having a low energy density may be irradiated on other areas.

The energy density of the irradiated laser may be less than about 1500 mJ/cm$^2$. The energy density of the irradiated laser less than about 1500 mJ/cm$^2$ may prevent carbonization of the insulating layer and the pixel definition layer. Also, the size of the beam of the irradiated laser and the interval between the beams of the adjacent lasers may be changed according to the design.

For example, the laser may be irradiated in the third direction DR3 as moving in the direction from the display area DA to the area, in which the opening area DTA is to be formed, or from the area, in which the opening area DTA is to be formed, to the display area DA. Since the first sacrificial layer S1 according to an embodiment covers the side of the first dam D1, it is possible to prevent foreign substance generated by the laser irradiation from being adhered on the side of the first dam D1 or the second dam D2.

According to the laser irradiation, the sacrificial layers S1, S2-$a$, S2-$b$, S2-$c$, and S2-$d$ may be separated from the first dam D1 and the third inorganic insulating layer IL3. The intermediate material layer EL-a and the second electrode material layer E2-$a$ deposited on the sacrificial layers S1, S2-$a$, S2-$b$, S2-$c$, and S2-$d$ may be removed. Also, the second electrode material layer E2-$a$ may be removed from the area where the sacrificial layers S1, S2-$a$, S2-$b$, S2-$c$, and S2-$d$ are not positioned, but the laser is irradiated.

Figure 14:
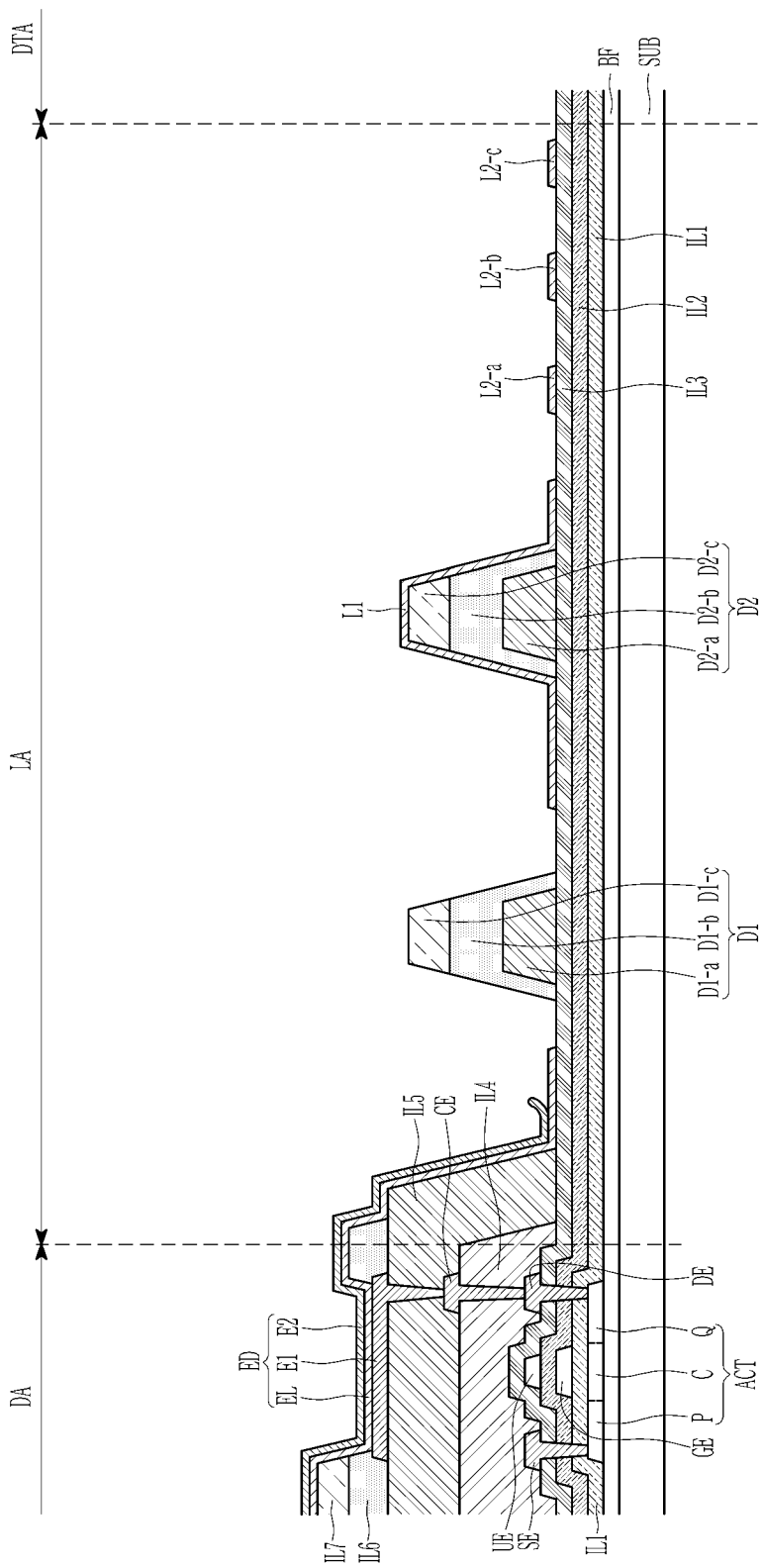

Through the processes of the laser irradiation and the removal of the sacrificial layer, as shown in FIG. 14, the first layer L1 and a plurality of second layers L2-$a$, L2-$b$, and L2-$c$ are formed in the peripheral area LA. The first layer L1 and a plurality of second layers L2-$a$, L2-$b$, and L2-$c$ may be formed in the same process as that of forming the intermediate layer EL. In the display area DA, a light emitting element ED including a first electrode E1, the intermediate layer EL, and a second electrode E2 is formed. The second electrode material layer including the same material as that of the second electrode E2 may be removed, except for the second electrode E2 extending from the display area DA and overlapping a portion of the peripheral area LA.

The first layer L1 may overlap the side and upper surfaces of the second dam D2. The first dam D1 does not overlap the layer including the same material as that of the intermediate layer EL, and the side and upper surfaces of the first dam D1 may be exposed. The spaced space between the first layer L1 and the second layers L2-a, L2-b, and L2-c may expose the third inorganic insulating layer IL3.

Figure 15:
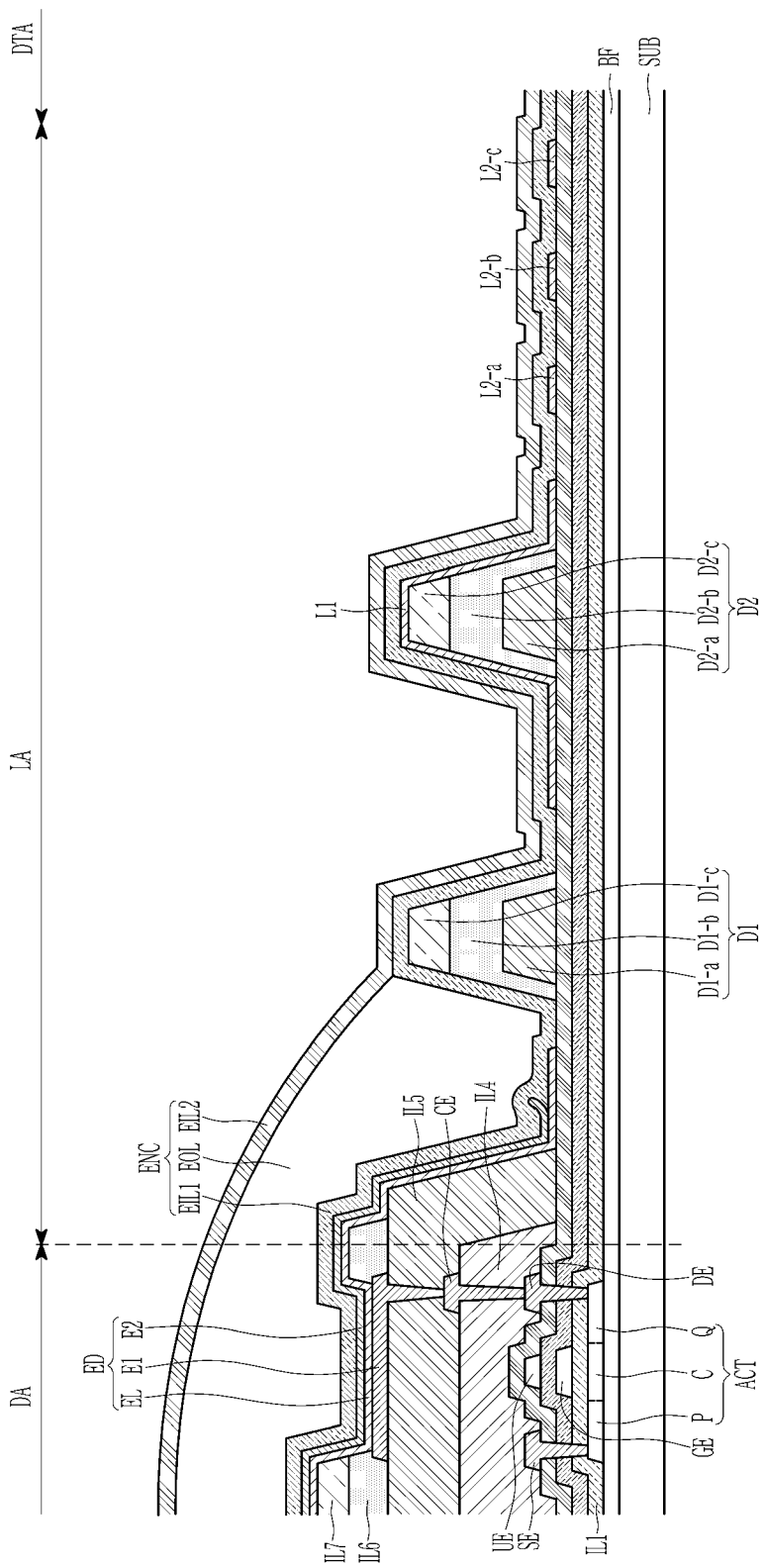

Next, as shown in FIG. 15, a first encapsulation inorganic layer EIL1 may be formed on the entire surface of the substrate SUB. The first encapsulation inorganic layer EIL1 may be in contact with the side and upper surfaces of the first dam D1. The first encapsulation inorganic layer EIL1 may be in contact with the first layer L1 and the second layers L2-a, L2-b, and L2-c. Also, the first encapsulation inorganic layer EIL1 may be in contact with the exposed third inorganic insulating layer IL3.

The encapsulation organic layer EOL may be formed to be positioned in a portion of the peripheral area LA while overlapping the display area DA. In the process of forming the encapsulation organic layer EOL, the liquid organic material may be prevented from spreading or overflowing by the first dam D1. The encapsulation organic layer EOL may be formed by an inkjet method in which a liquid organic material is coated on the first encapsulation inorganic layer EIL1. For example, the first dam D1 sets the boundary of the area where the organic material of the liquid is coated and prevents the organic material of the liquid from overflowing to the outside of the first dam D1. After that, a second encapsulation inorganic layer EIL2 may be formed on the encapsulation organic layer EOL so as to overlap the entire surface of the substrate SUB. The first encapsulation inorganic layer EIL1 and the second encapsulation inorganic layer EIL2 may be in contact with each other in the peripheral area LA, particularly between the first dam D1 and the opening area DTA.

Then, the opening area DTA may be formed to provide the display panel DP as shown in FIG. 6. The opening area DTA may be formed to penetrate through the substrate. The opening area DTA may be formed by a laser or drilling process. Next, the first electronic module EM1 may be mounted on the opening area DTA.

In the laser irradiation process or the drilling process according to an embodiment, some particles may inflow into the display panel DP. For example, even if the particles inflow in the peripheral area LA, the intermediate layer, which is the moisture permeation path, is disconnected between the second dam D2 and the opening area DTA, and on the upper and side surfaces of the first dam D1, so that the moisture penetration path may be blocked.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate comprising an opening area, a peripheral area surrounding the opening area, and a display area surrounding the peripheral area;
a transistor disposed on the display area of the substrate;
a first electrode electrically connected to the transistor;
an intermediate layer overlapping the first electrode;
a second electrode disposed on the intermediate layer;
a first dam and a second dam disposed on the peripheral area of the substrate; and
a first layer disposed on the second dam and comprising a same material as that of at least a part of the intermediate layer,
wherein:
an end of the second electrode is disposed in a region of the peripheral area disposed between the display area and the first dam,
the first dam is disposed between the display area and the second dam,
the first dam is disposed between the region and the opening area,
the first layer covers an upper surface and a side surface of the second dam, and
the first layer is spaced apart from the first dam.

2. The display device of claim 1, further comprising:
a first encapsulation inorganic layer directly contacting an upper surface of the first dam.

3. The display device of claim 2, wherein:
the first encapsulation inorganic layer directly contacts a side of the second dam, and
the first encapsulation inorganic layer directly contacts an upper surface of the second dam.

4. The display device of claim 2, wherein the first layer directly contacts the first encapsulation inorganic layer.

5. The display device of claim 2, wherein:
the display device further comprises one or more second layers disposed between the first dam and the opening area, and
the one or more second layers comprise a same material as that of at least a part of the intermediate layer.

6. The display device of claim 5, wherein:
the display device further comprises an inorganic insulating layer disposed between the transistor and the substrate, and
the one or more second layers expose the inorganic insulating layer.

7. The display device of claim 6, wherein ends of the substrate, the inorganic insulating layer, and the first encapsulation inorganic layer define an inner surface of the opening area.

8. The display device of claim 5, wherein the intermediate layer and the one or more second layers comprise at least one of a hole transport layer, a hole injection layer, an electron injection layer, and an electron transport layer.

9. The display device of claim 1, wherein the intermediate layer and the first layer comprise at least one of a hole transport layer, a hole injection layer, an electron injection layer, and an electron transport layer.

10. The display device of claim 1, wherein:
the upper surface of the first dam forms a horizontal surface in a cross-sectional view of the display device, a plane of the cross-sectional view being transverse to an upper surface of the substrate,
the display device further comprises a third layer,
in a direction perpendicular to the upper surface of the substrate, the third layer overlaps only the upper surface of the first dam and does not overlap side surfaces of the first dam, and
the third layer comprises a same material as that of at least a part of the intermediate layer.

11. The display device of claim 10, wherein an edge of the third layer and an edge of the upper surface of the first dam are aligned.

12. The display device of claim 1, wherein the display device further comprises:
an encapsulation organic layer disposed on the first encapsulation inorganic layer; and
a second encapsulation inorganic layer disposed on the encapsulation organic layer, and
wherein the first encapsulation inorganic layer and the second encapsulation inorganic layer directly contact each other in a region of the peripheral area disposed between the first dam and the opening area.

13. A display device comprising:
a substrate comprising an opening area, a peripheral area surrounding the opening area, and a display area surrounding the peripheral area;
a transistor disposed on the substrate;
a first electrode electrically connected to the transistor;
an intermediate layer overlapping the first electrode;
a second electrode disposed on the intermediate layer;
a first dam and a second dam disposed on the peripheral area of the substrate;
a first layer disposed on the second dam and comprising a same material as that of at least a part of the intermediate layer; and
a first encapsulation inorganic layer disposed on the second electrode and overlapping each of the first dam and the second dam,
wherein:
ends of the intermediate layer and the second electrode overlap the peripheral area,
the first encapsulation inorganic layer covers the ends of the intermediate layer and the second electrode,
the first encapsulation inorganic layer directly contacts at least a part of a side of the first dam and is spaced apart from the second dam by at least the first layer,
the first layer covers an upper surface and a side surface of the second dam, and
the first layer is spaced apart from the first dam.

14. The display device of claim 13, wherein the first encapsulation inorganic layer completely covers the side of the first dam.

15. The display device of claim 14, wherein the first encapsulation inorganic layer covers an upper surface of the first dam.

16. The display device of claim 13, wherein:
the display device further comprises an inorganic insulating layer disposed between the substrate and the transistor, and
the first encapsulation inorganic layer directly contacts at least a part of the inorganic insulating layer in a region of the peripheral area.

17. The display device of claim 13, wherein:
the first encapsulation inorganic layer directly contacts a side of at least one of the first dam and the second dam.

18. The display device of claim 13, wherein the intermediate layer comprises at least one of a hole transport layer, a hole injection layer, an electron injection layer, and an electron transport layer.

19. The display device of claim 13, wherein
the display device further comprises an encapsulation organic layer and a second encapsulation inorganic layer disposed on the first encapsulation inorganic layer; and
in at least a part of the peripheral area, the first encapsulation inorganic layer and the second encapsulation inorganic layer directly contact one another.

* * * * *